(12) United States Patent
Yang et al.

(10) Patent No.: US 10,629,679 B2
(45) Date of Patent: Apr. 21, 2020

(54) METHOD OF MANUFACTURING A SEMICONDUCTOR DEVICE AND A SEMICONDUCTOR DEVICE

(71) Applicant: TAIWAN SEMICONDUCTOR MANUFACTURING CO., LTD., Hsinchu (TW)

(72) Inventors: Yu-Lin Yang, Hsinchu County (TW); Chao-Ching Cheng, Hsinchu (TW); Tzu-Chiang Chen, Hsinchu (TW); I-Sheng Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/801,200

(22) Filed: Nov. 1, 2017

(65) Prior Publication Data

US 2019/0067418 A1    Feb. 28, 2019

Related U.S. Application Data

(60) Provisional application No. 62/552,895, filed on Aug. 31, 2017.

(51) Int. Cl.
*H01L 29/786* (2006.01)
*H01L 29/66* (2006.01)
(Continued)

(52) U.S. Cl.
CPC .......... *H01L 29/0653* (2013.01); *B82Y 10/00* (2013.01); *H01L 21/3065* (2013.01);
(Continued)

(58) Field of Classification Search
CPC ............ H01L 29/785; H01L 29/42392; H01L 29/41791; H01L 29/66795; H01L 21/283;
(Continued)

(56) References Cited

U.S. PATENT DOCUMENTS 6,071,783 A * 6/2000 Liang .................. H01L 29/0653
257/E21.431
9,209,247 B2 12/2015 Colinge et al.
(Continued)

FOREIGN PATENT DOCUMENTS

KR    10-2017-0063353 A    6/2017

*Primary Examiner* — Brian Turner
(74) *Attorney, Agent, or Firm* — McDermott Will & Emery LLP

(57) ABSTRACT

In a method of manufacturing a semiconductor device, a fin structure, in which first semiconductor layers and second semiconductor layers are alternately stacked, is formed. A sacrificial gate structure is formed over the fin structure. The first semiconductor layers, the second semiconductor layer and an upper portion of the fin structure at a source/drain region of the fin structure, which is not covered by the sacrificial gate structure, are etched. A dielectric layer is formed over the etched upper portion of the fin structure. A source/drain epitaxial layer is formed. The source/drain epitaxial layer is connected to ends of the second semiconductor wires, and a bottom of the source/drain epitaxial layer is separated from the fin structure by the dielectric layer.

14 Claims, 28 Drawing Sheets

(51) Int. Cl.
*H01L 29/78* (2006.01)
*H01L 29/10* (2006.01)
*H01L 29/06* (2006.01)
*H01L 29/423* (2006.01)
*H01L 21/306* (2006.01)
*H01L 29/04* (2006.01)
*H01L 21/3065* (2006.01)
*H01L 29/08* (2006.01)
*H01L 29/775* (2006.01)
*B82Y 10/00* (2011.01)

(52) U.S. Cl.
CPC ...... *H01L 21/30604* (2013.01); *H01L 29/045* (2013.01); *H01L 29/0673* (2013.01); *H01L 29/0847* (2013.01); *H01L 29/1079* (2013.01); *H01L 29/42392* (2013.01); *H01L 29/6653* (2013.01); *H01L 29/6681* (2013.01); *H01L 29/66439* (2013.01); *H01L 29/66545* (2013.01); *H01L 29/66553* (2013.01); *H01L 29/66742* (2013.01); *H01L 29/66772* (2013.01); *H01L 29/775* (2013.01); *H01L 29/7853* (2013.01); *H01L 29/78618* (2013.01); *H01L 29/78654* (2013.01); *H01L 29/78684* (2013.01); *H01L 29/78696* (2013.01)

(58) Field of Classification Search
CPC ............. H01L 29/665; H01L 29/66545; H01L 2029/7858; H01L 29/165
See application file for complete search history.

(56) References Cited

U.S. PATENT DOCUMENTS

| | | | |
|---|---|---|---|
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,660,028 B1 | 5/2017 | Cheng et al. | |
| 10,103,238 B1* | 10/2018 | Zang | H01L 21/311 |
| 2005/0280052 A1* | 12/2005 | Holz | H01L 29/0653 257/288 |
| 2009/0289288 A1 | 11/2009 | Wu | |
| 2012/0138886 A1* | 6/2012 | Kuhn | B82Y 10/00 257/9 |
| 2014/0091279 A1* | 4/2014 | Kachian | B82Y 10/00 257/27 |
| 2014/0175554 A1* | 6/2014 | Loubet | H01L 21/82343 257/368 |
| 2014/0239399 A1* | 8/2014 | Nagumo | H01L 29/785 257/347 |
| 2014/0312398 A1* | 10/2014 | Ching | H01L 29/66795 257/288 |
| 2014/0312432 A1 | 10/2014 | Ching et al. | |
| 2015/0179645 A1* | 6/2015 | Liao | H01L 29/41791 257/77 |
| 2015/0340490 A1 | 11/2015 | An et al. | |
| 2016/0035849 A1 | 2/2016 | Ching et al. | |
| 2016/0111495 A1* | 4/2016 | Brand | H01L 29/0673 438/283 |
| 2016/0190317 A1* | 6/2016 | Liu | H01L 29/7848 257/192 |
| 2016/0211372 A1* | 7/2016 | Yu | H01L 29/7848 |
| 2016/0260820 A1* | 9/2016 | Li | H01L 21/82342 |
| 2016/0329429 A1* | 11/2016 | Cheng | H01L 29/7851 |
| 2016/0365420 A1* | 12/2016 | Leobandung | H01L 29/785 |
| 2017/0069763 A1 | 3/2017 | Doris et al. | |
| 2017/0154958 A1 | 6/2017 | Fung et al. | |
| 2017/0194213 A1 | 7/2017 | Ching et al. | |
| 2018/0090569 A1* | 3/2018 | Yang | H01L 29/78696 |

* cited by examiner

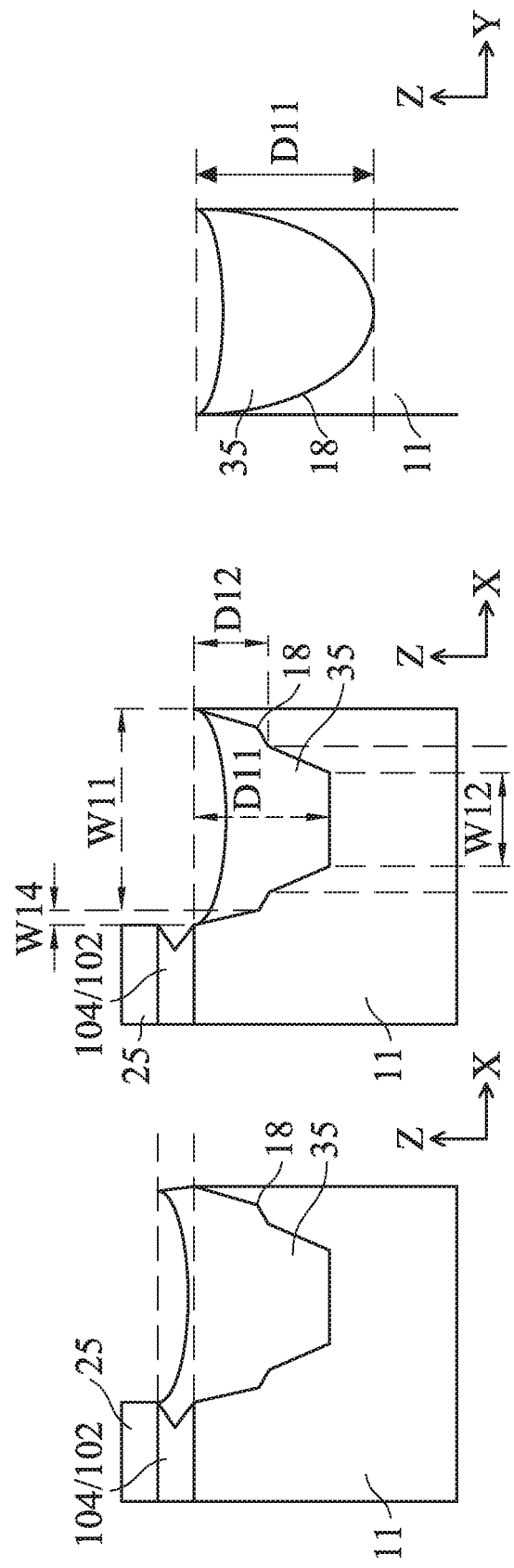

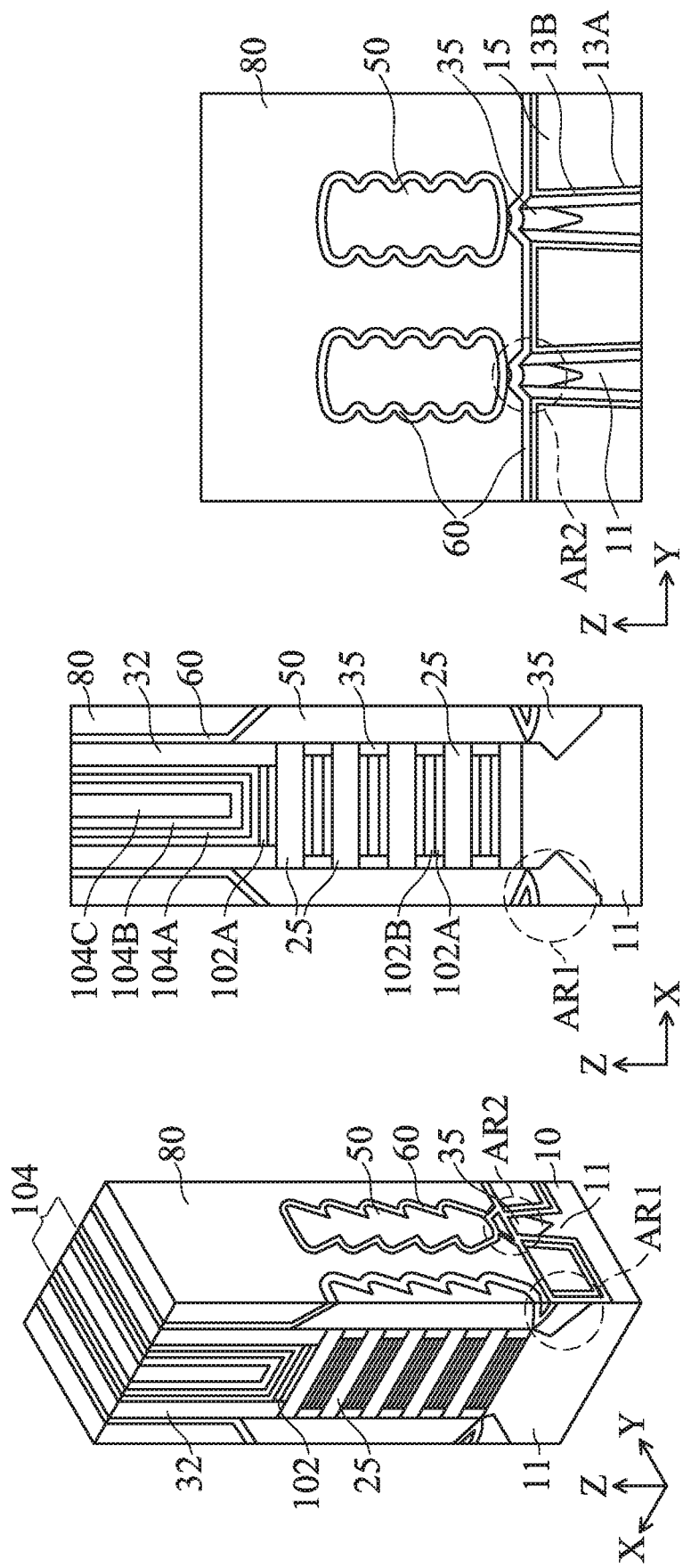

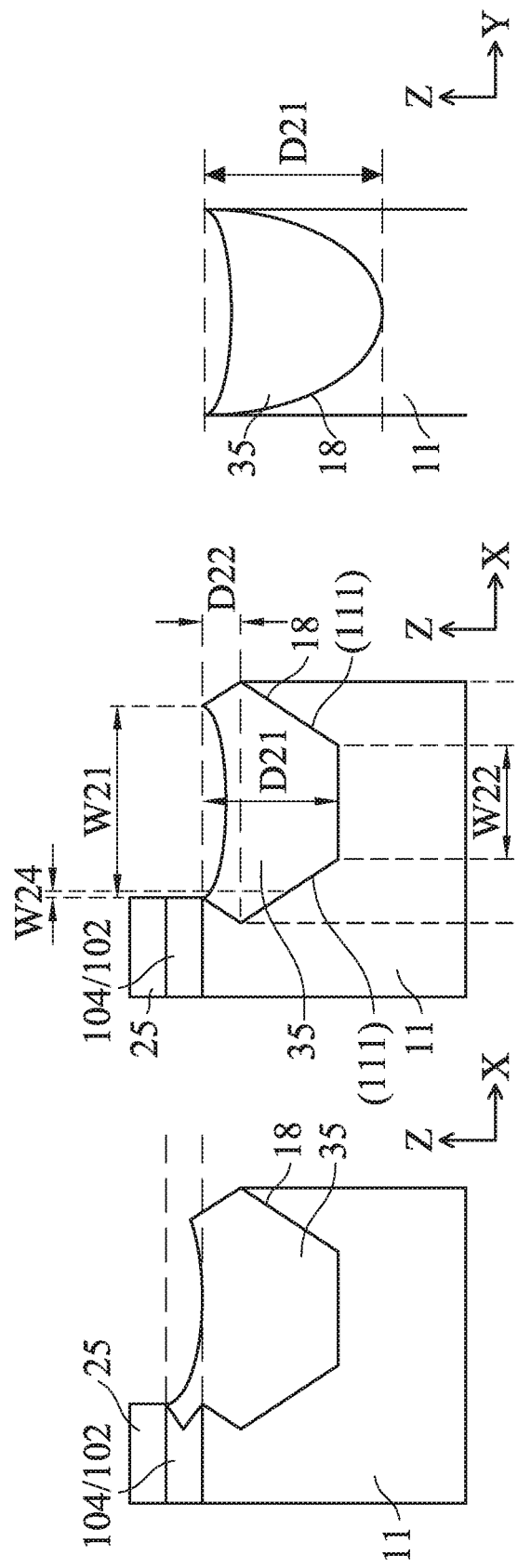

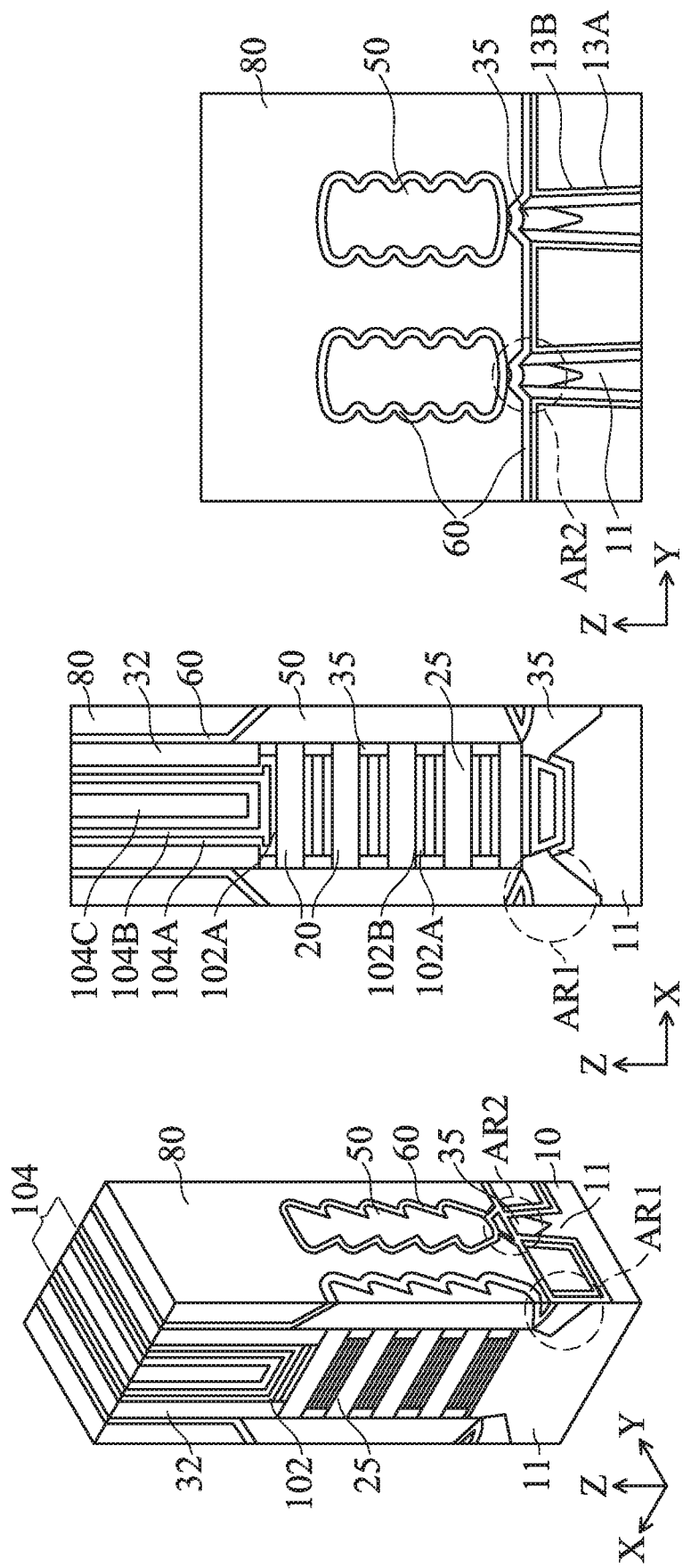

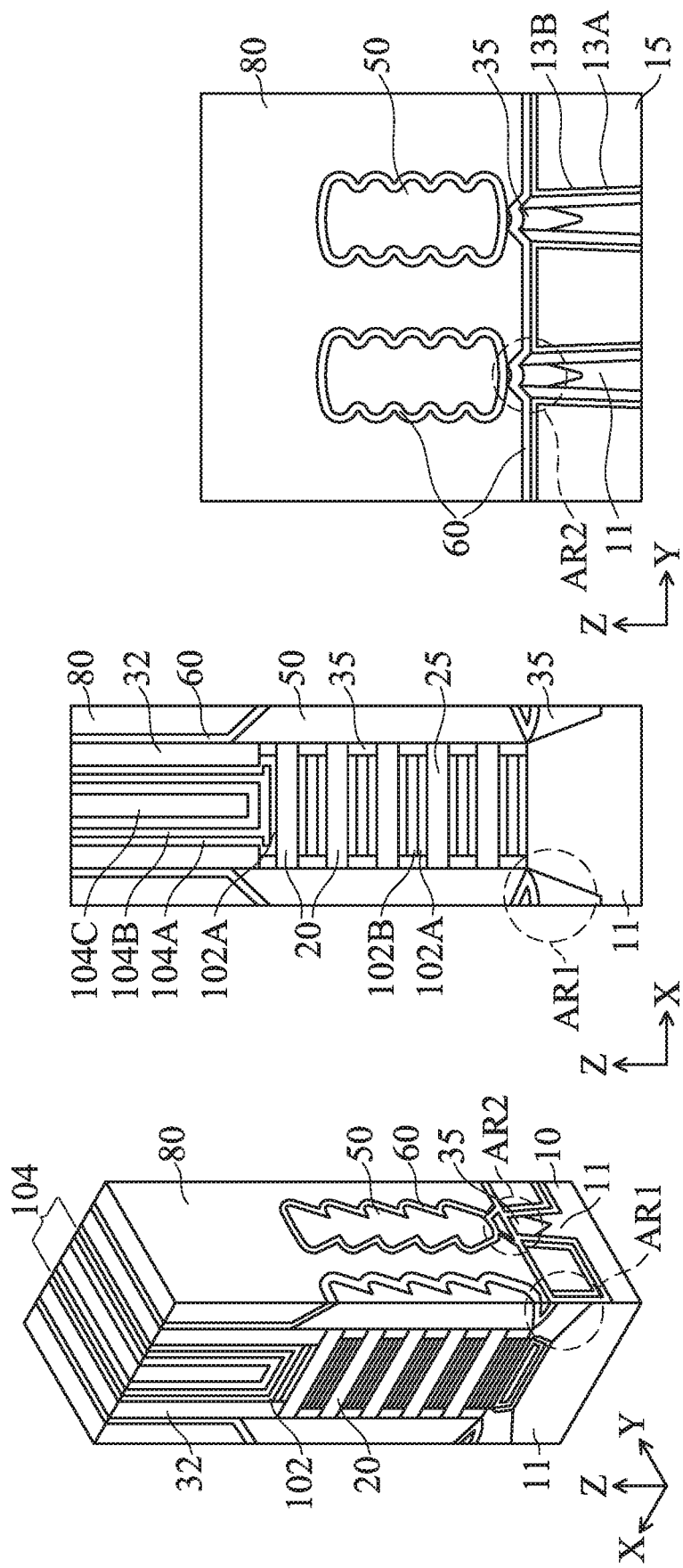

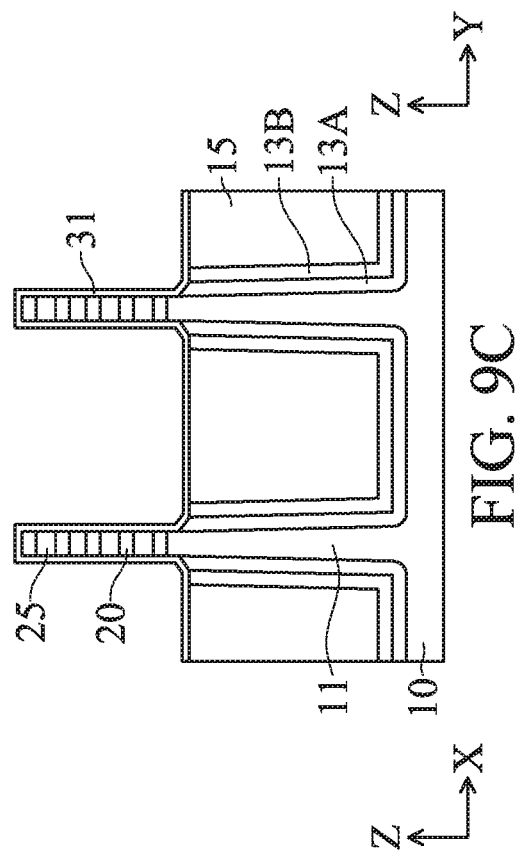
FIG. 9A
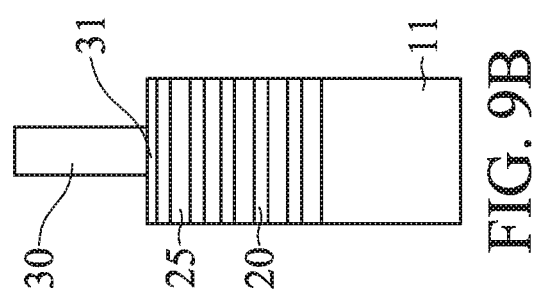
FIG. 9B
FIG. 9C
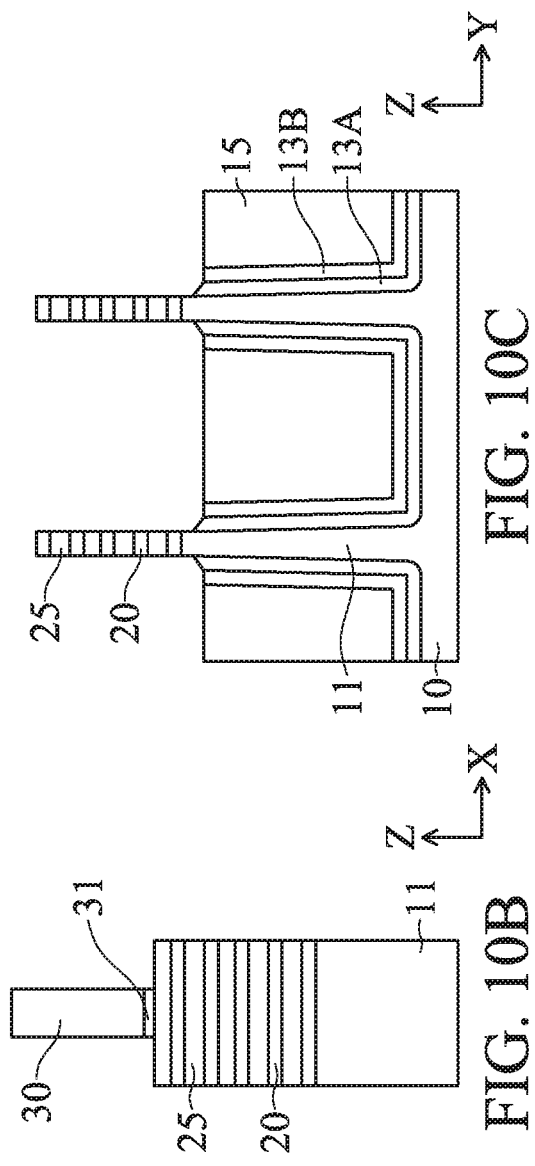
FIG. 10A
FIG. 10B
FIG. 10C

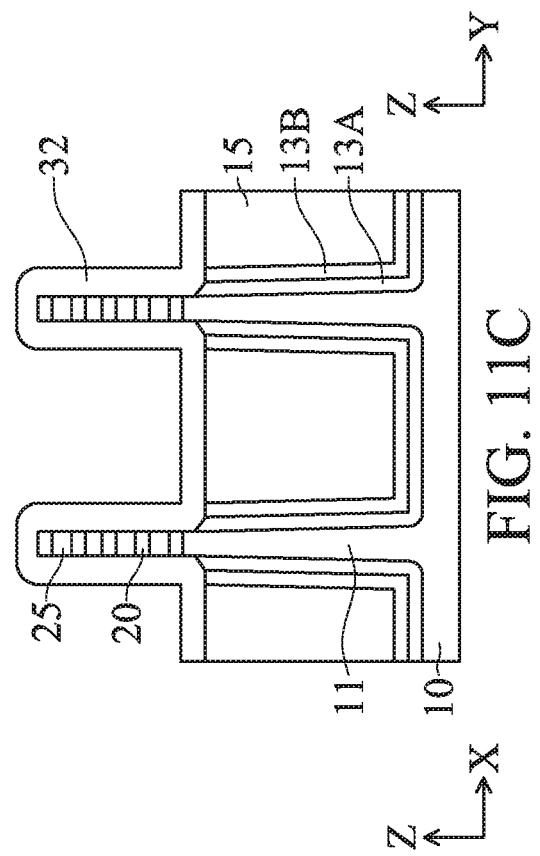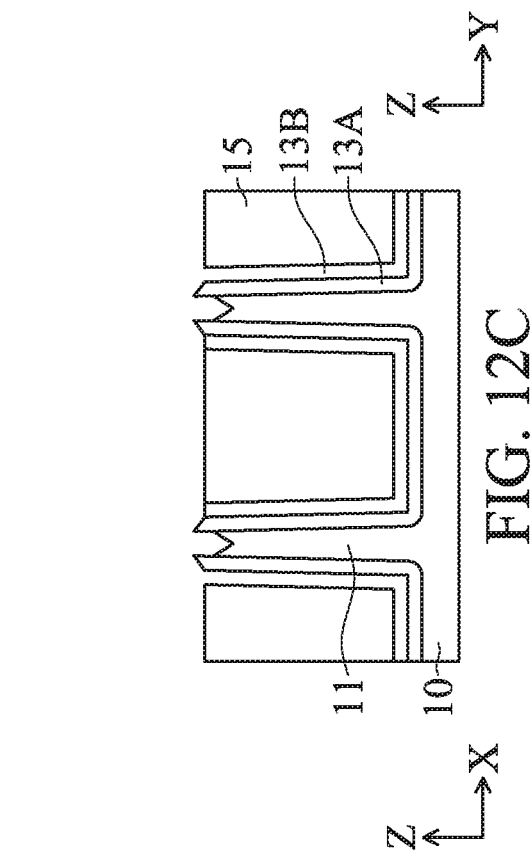

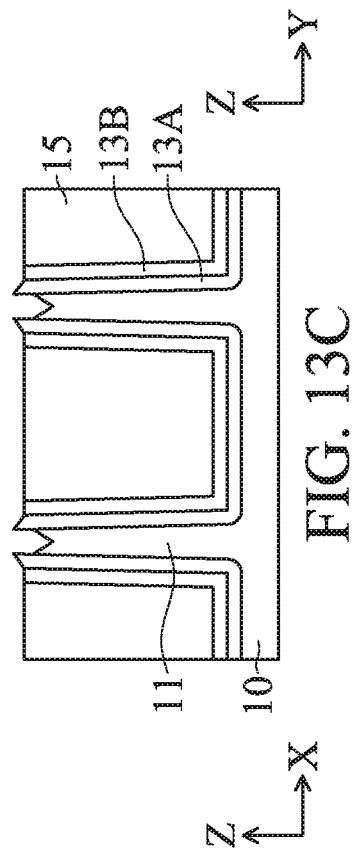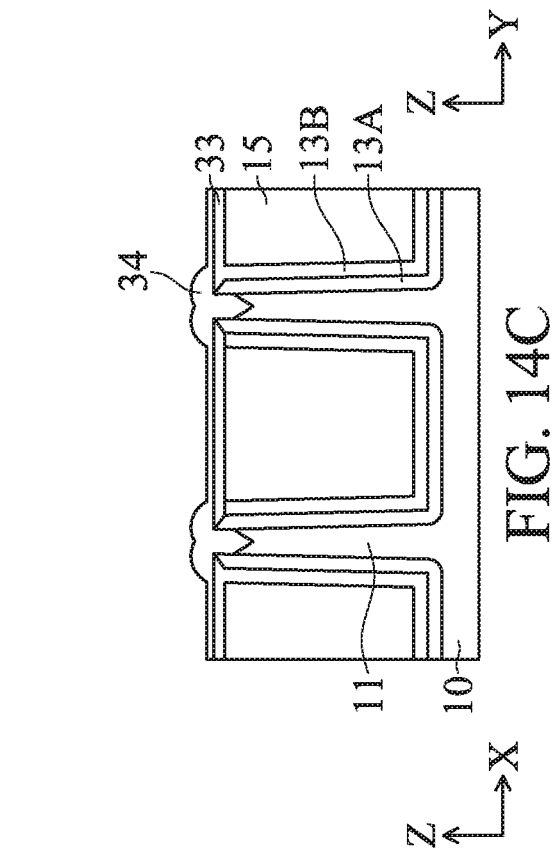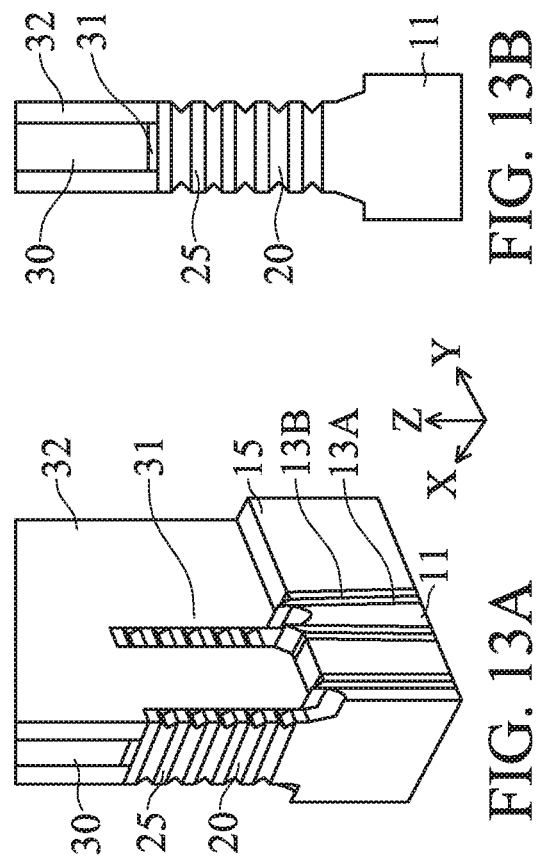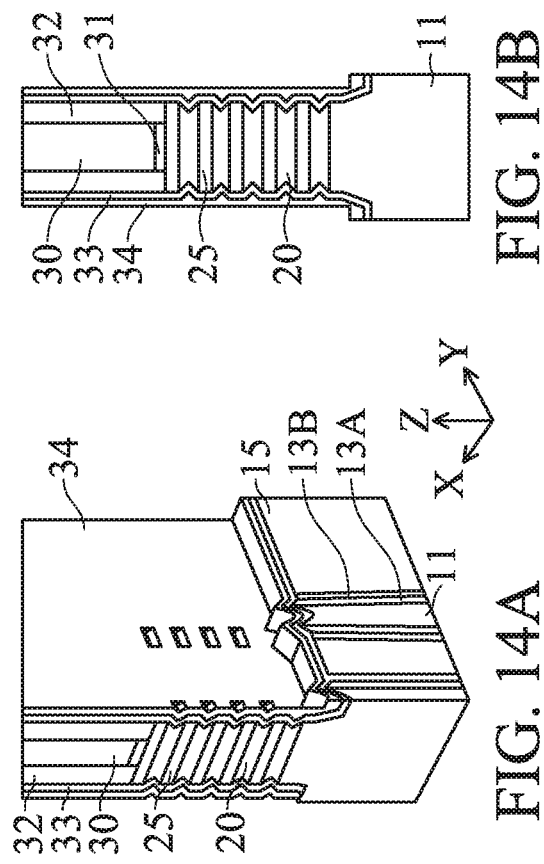

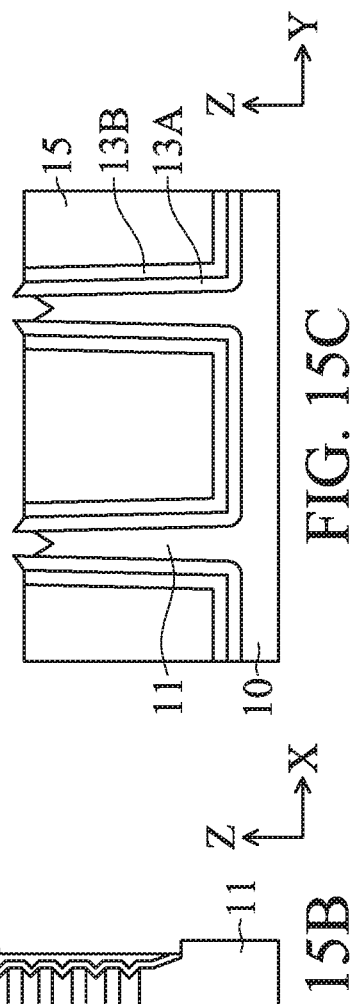
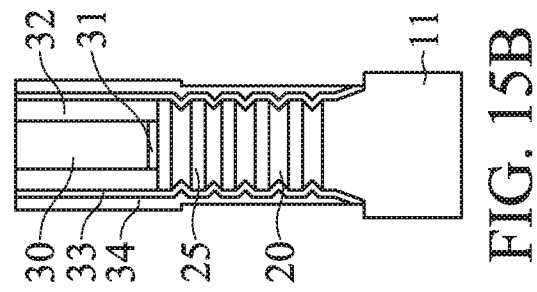
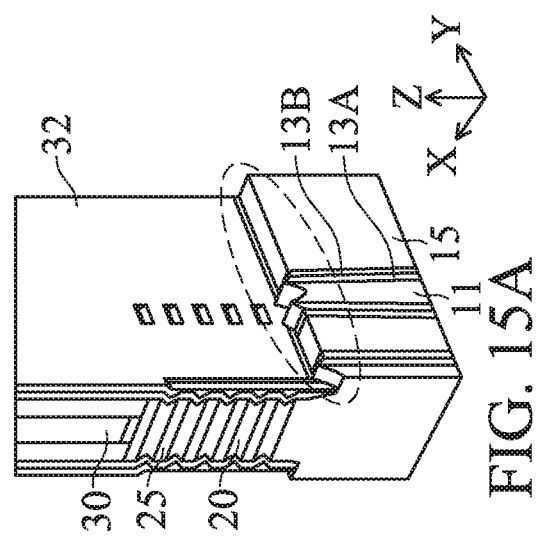
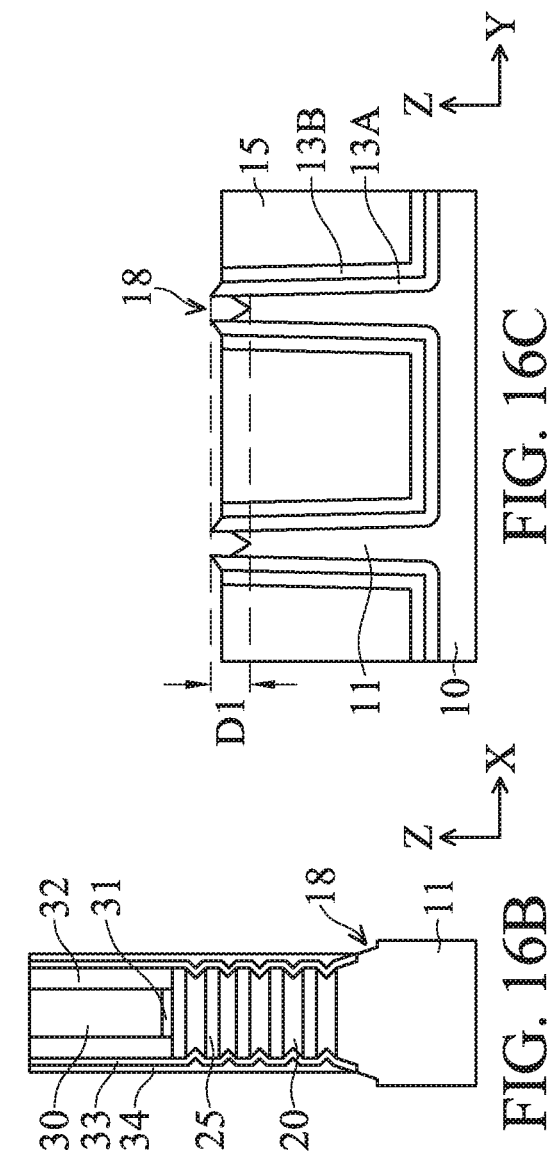
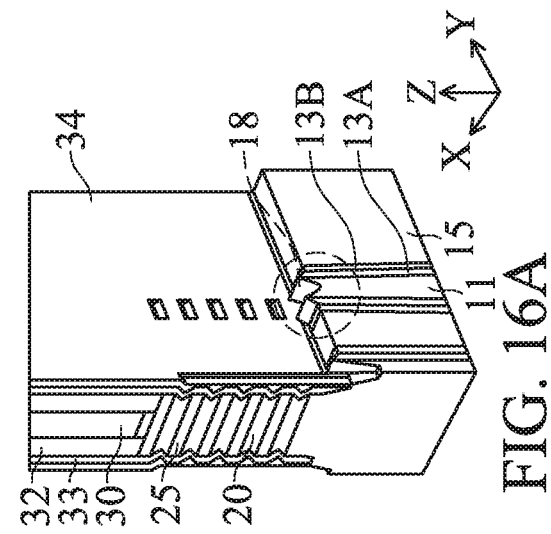

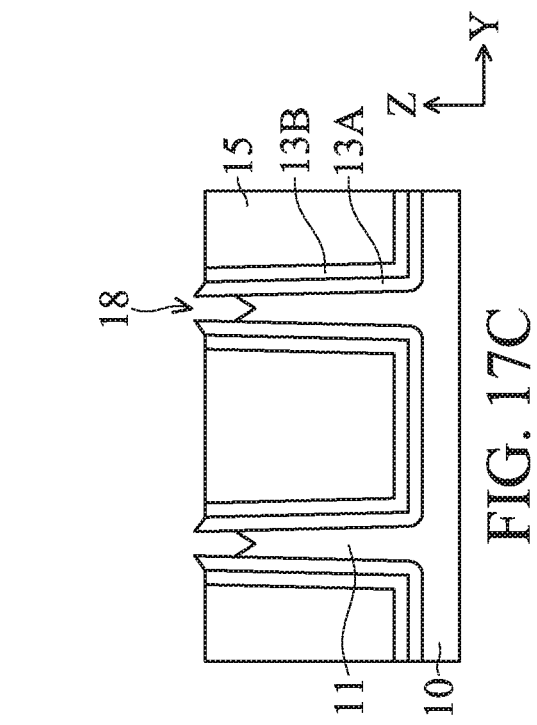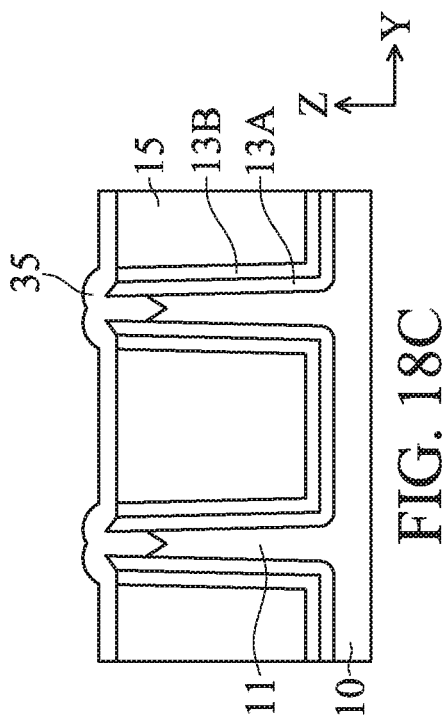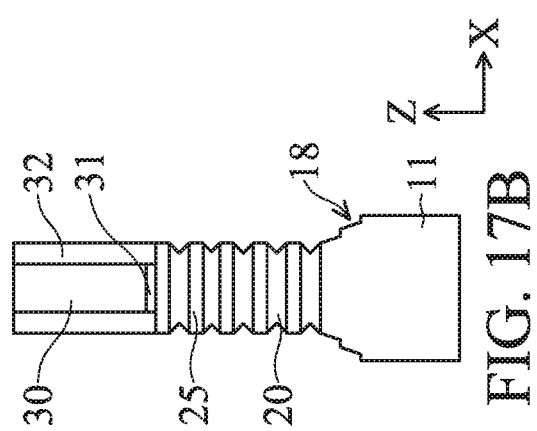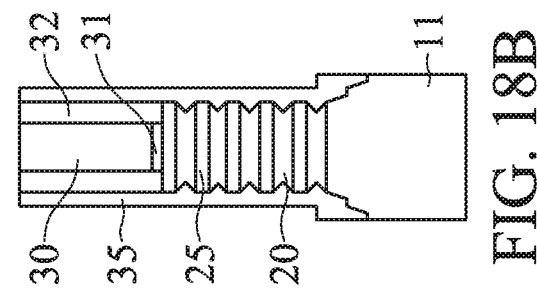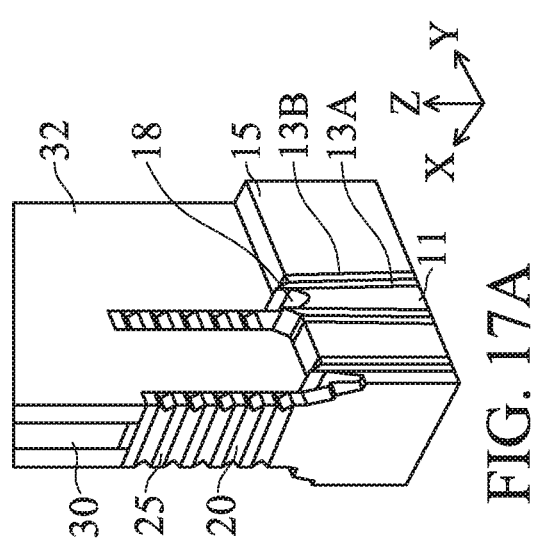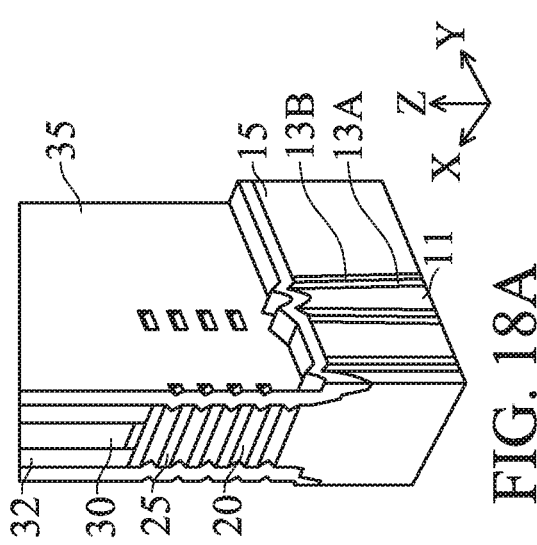

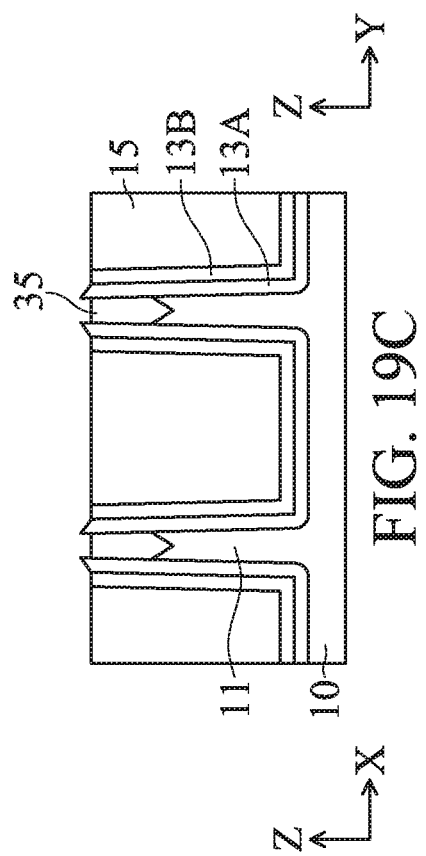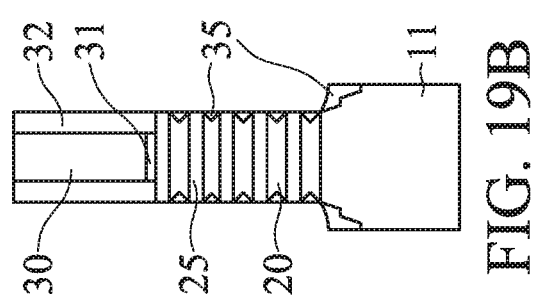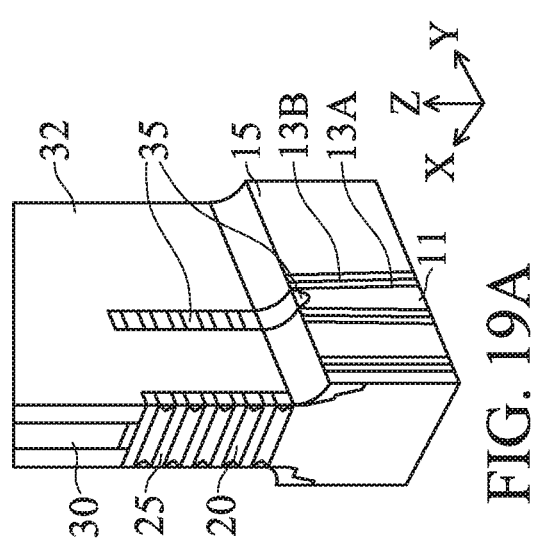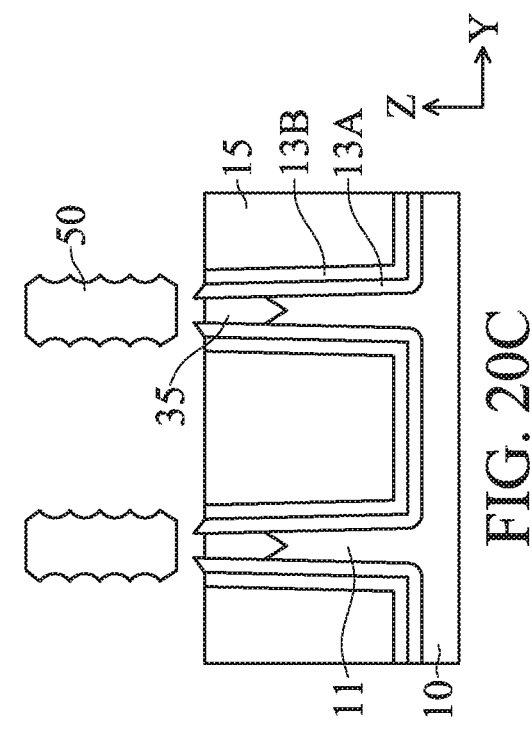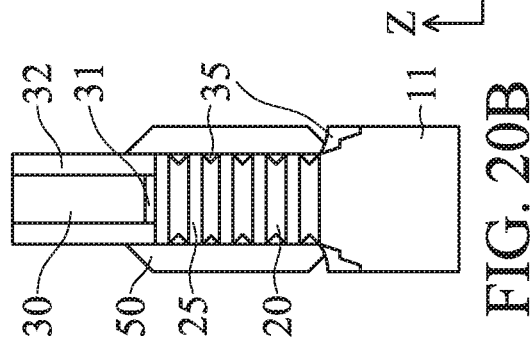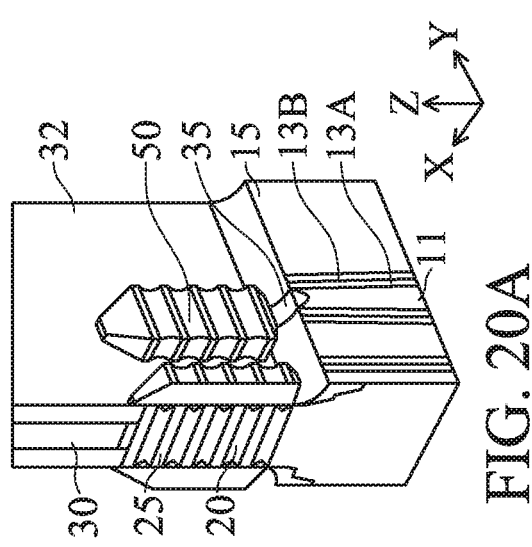

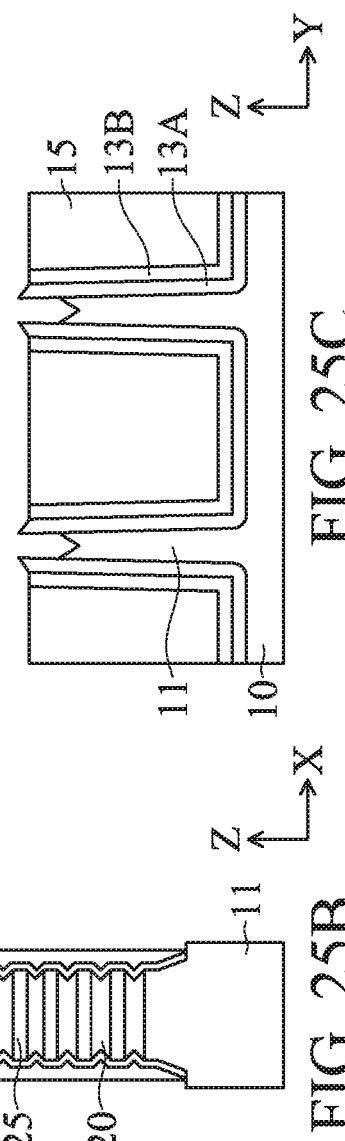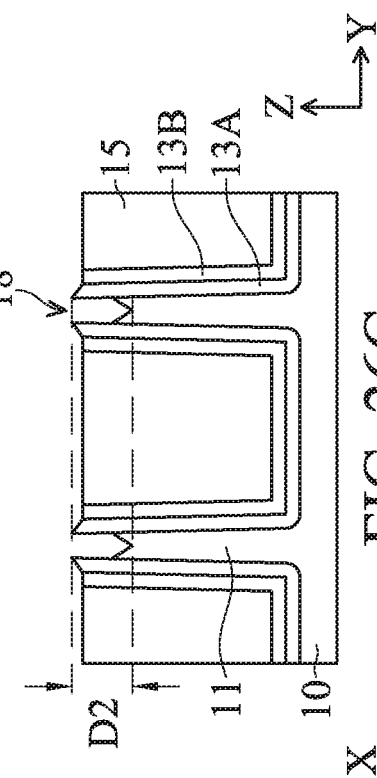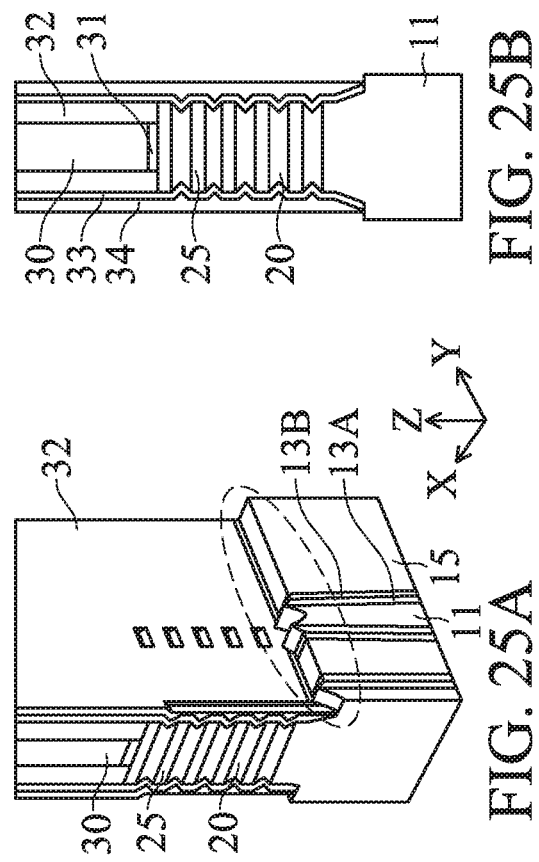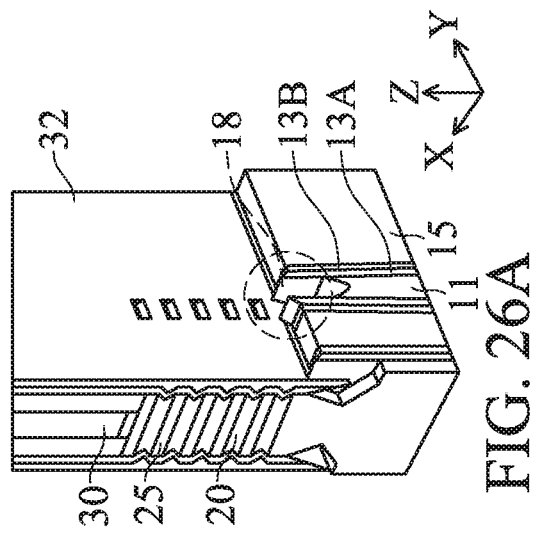
FIG. 25A  FIG. 25B  FIG. 25C
FIG. 26A  FIG. 26B  FIG. 26C

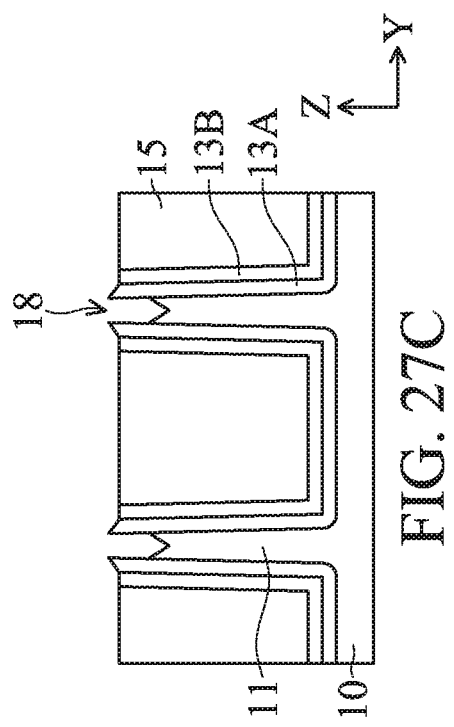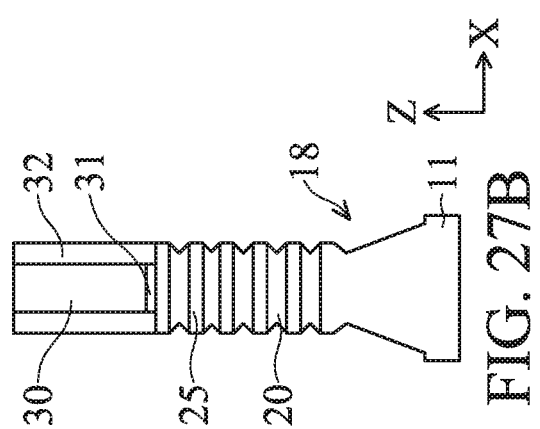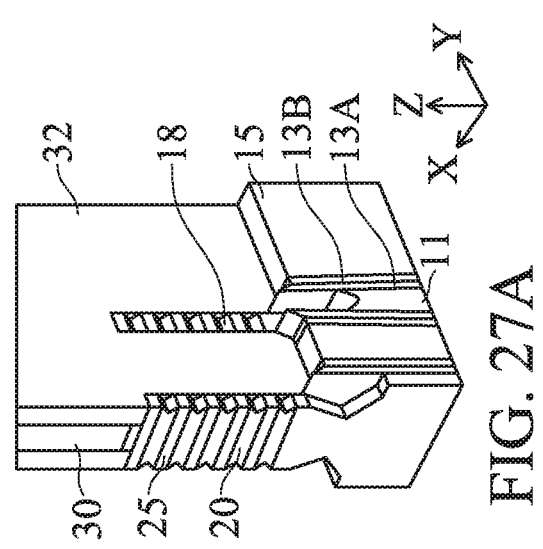
FIG. 27A  FIG. 27B  FIG. 27C
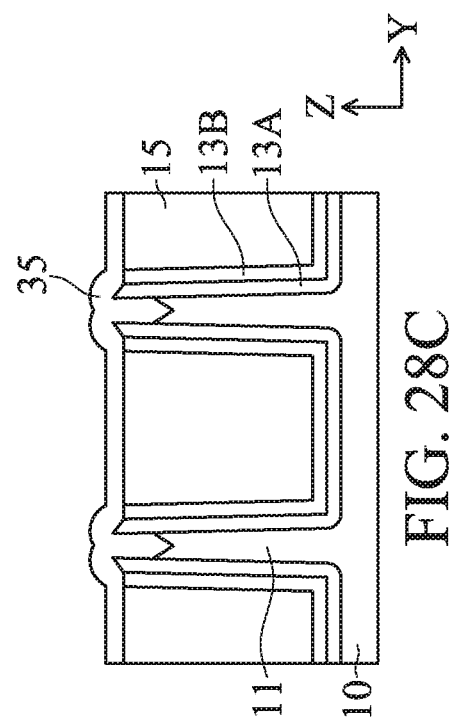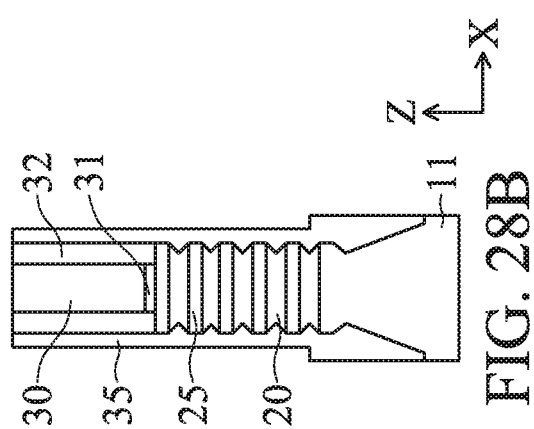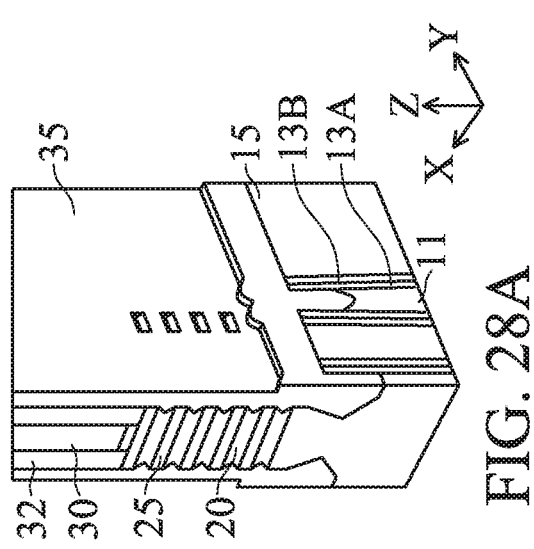
FIG. 28A  FIG. 28B  FIG. 28C

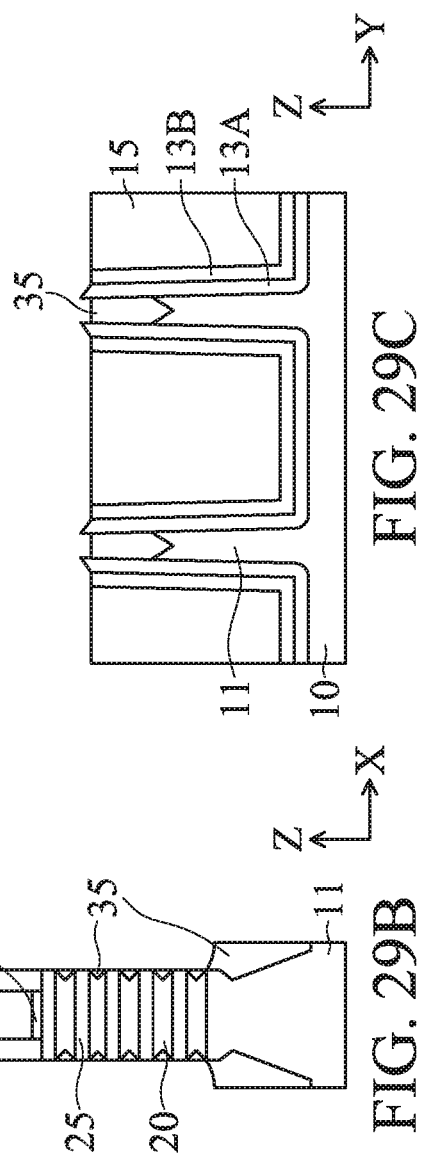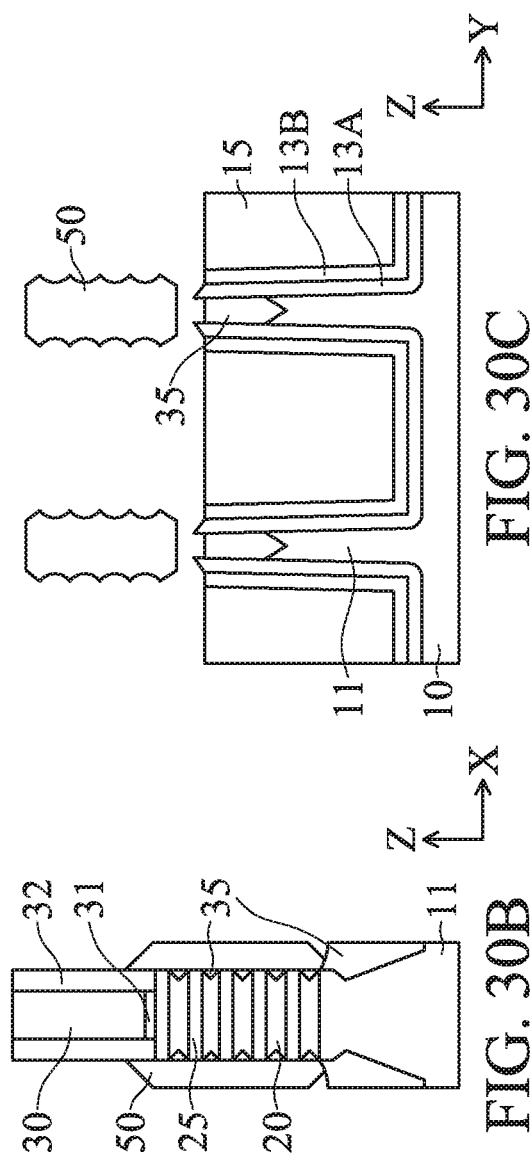

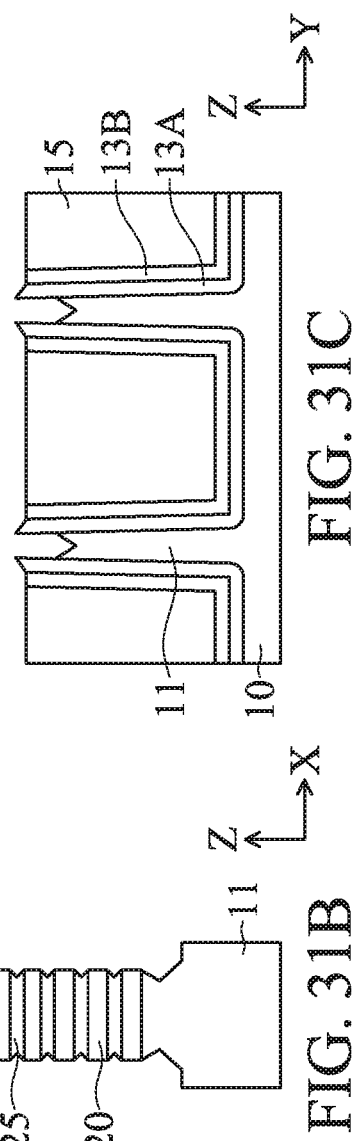
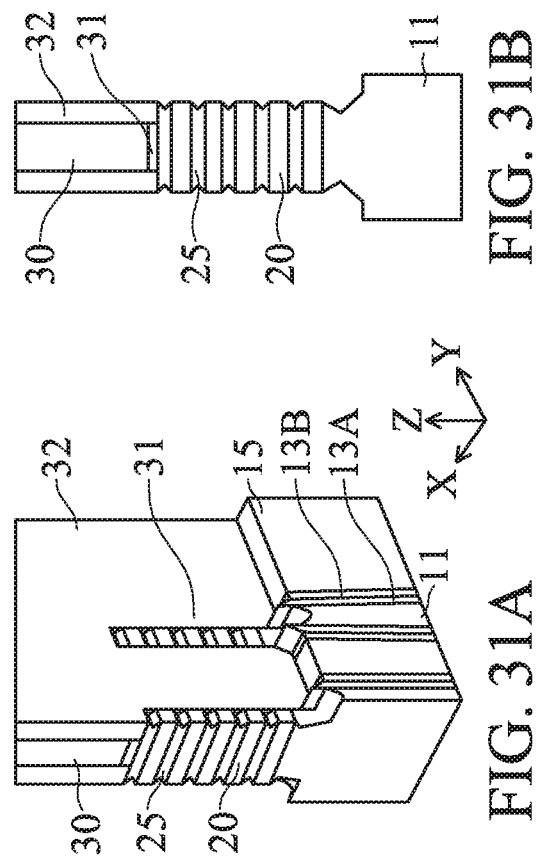
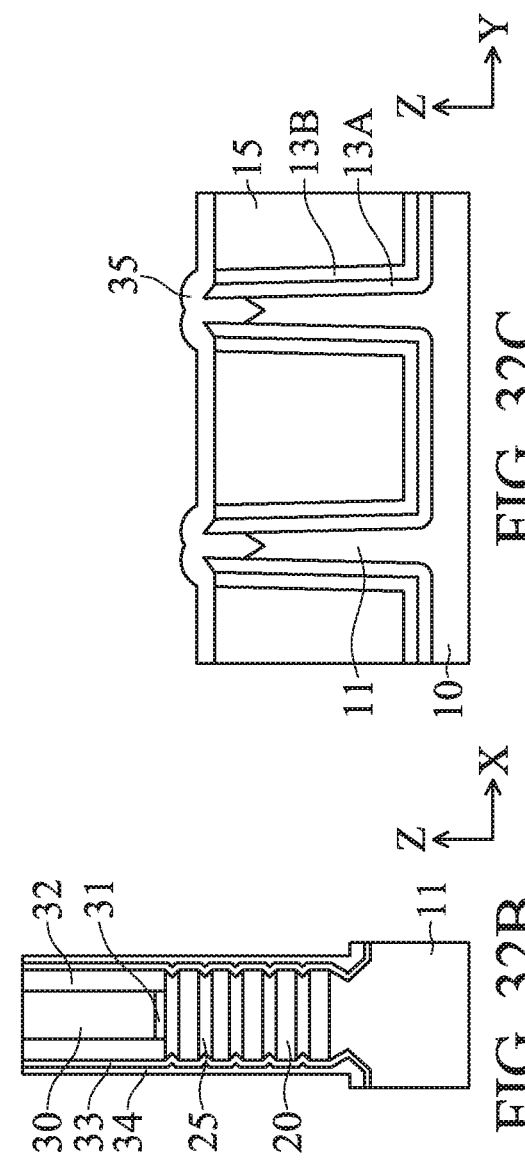
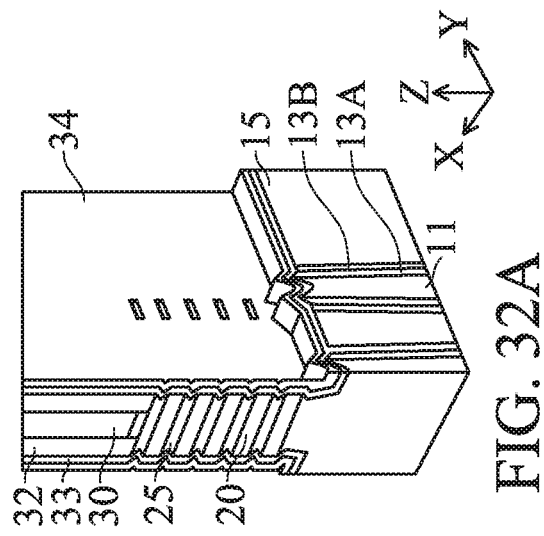

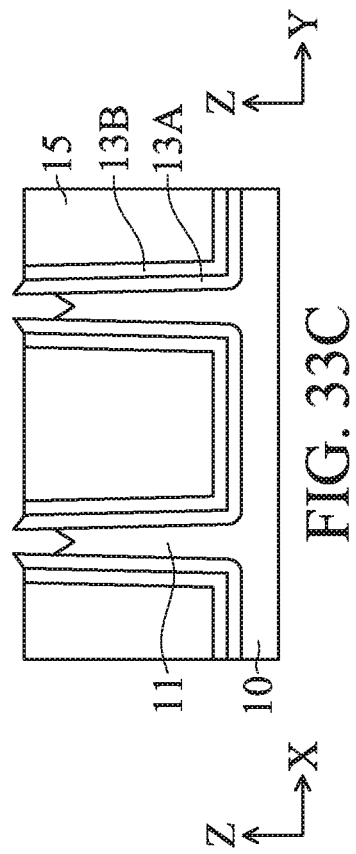
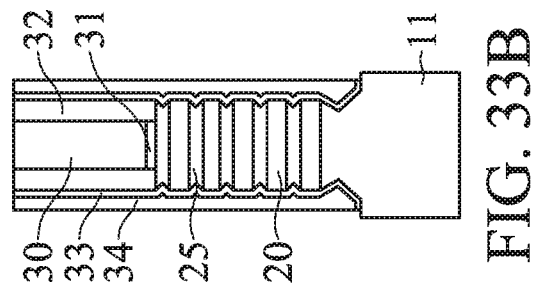
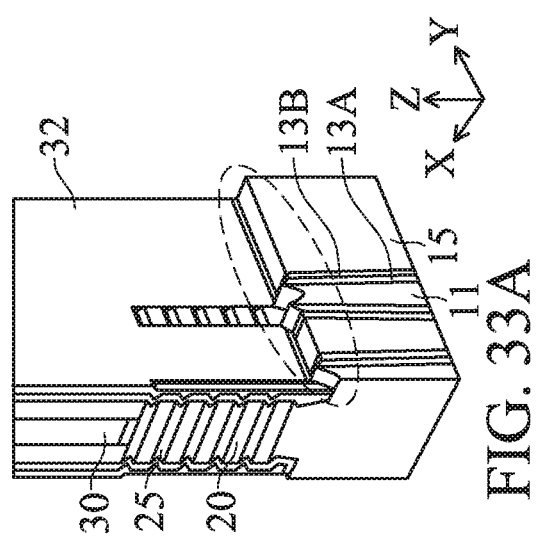
FIG. 33A  FIG. 33B  FIG. 33C
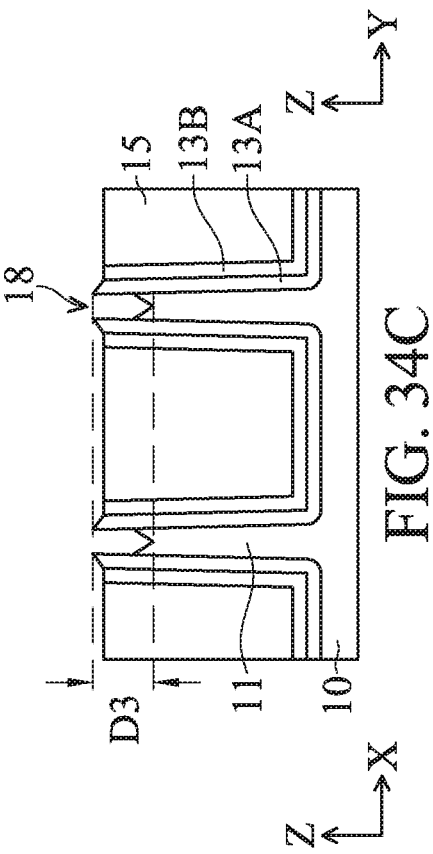
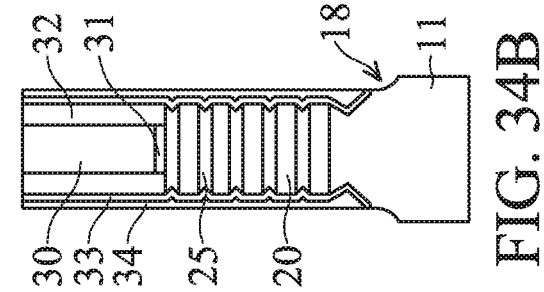
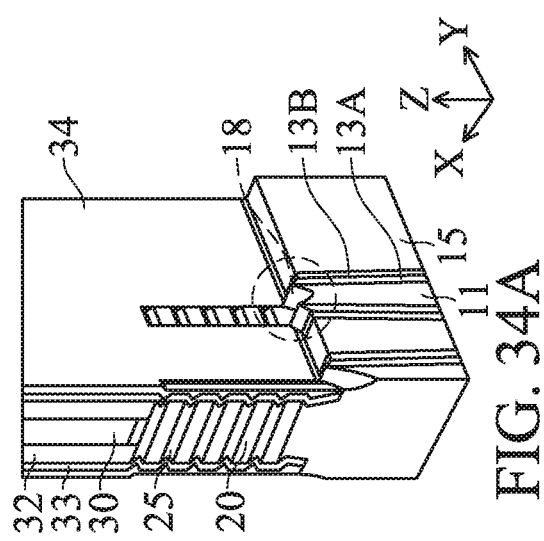
FIG. 34A  FIG. 34B  FIG. 34C

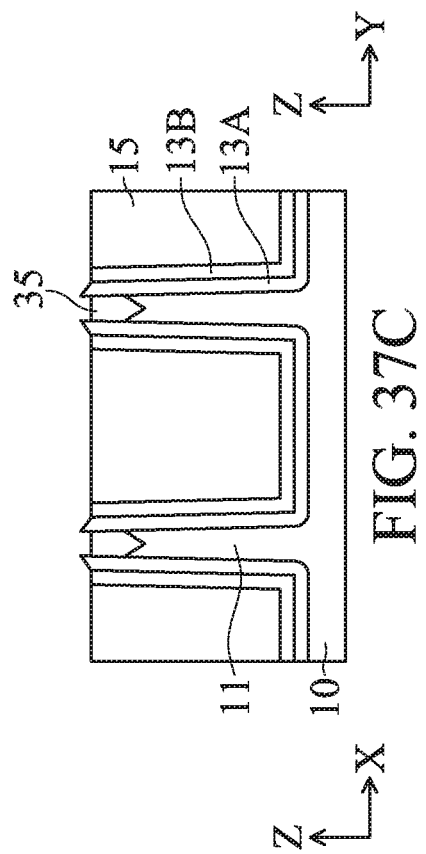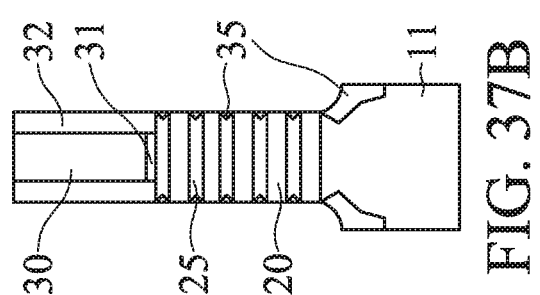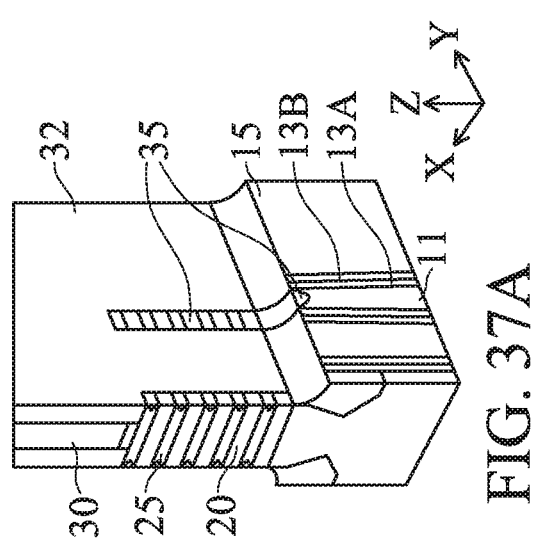
FIG. 37A
FIG. 37B
FIG. 37C
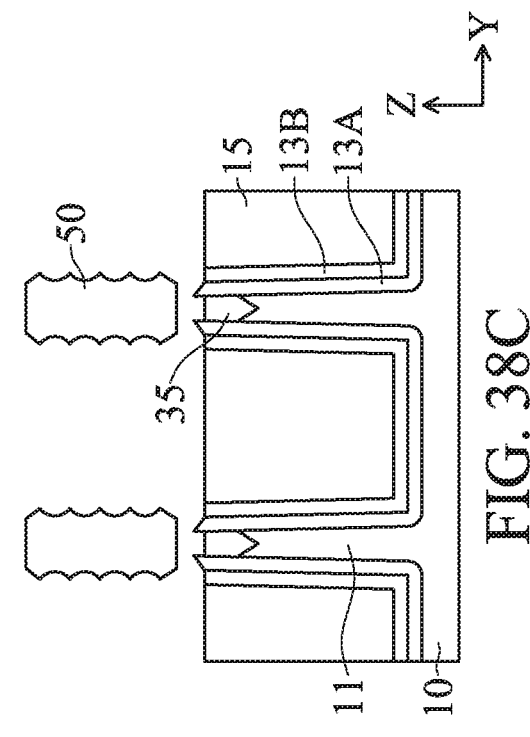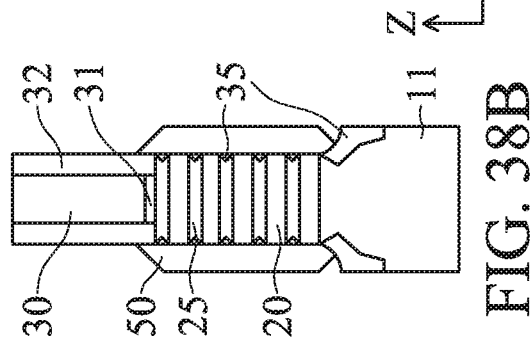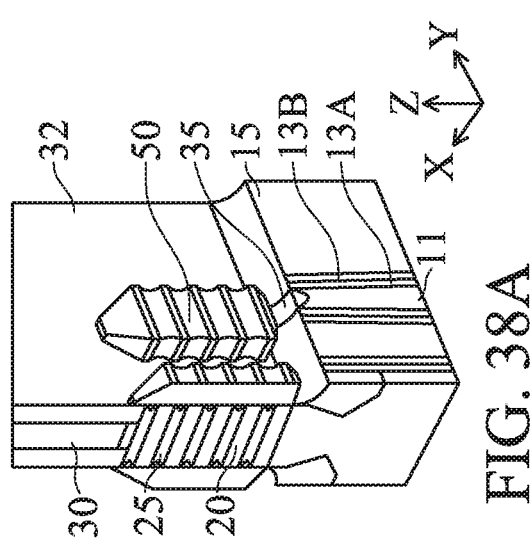
FIG. 38A
FIG. 38B
FIG. 38C

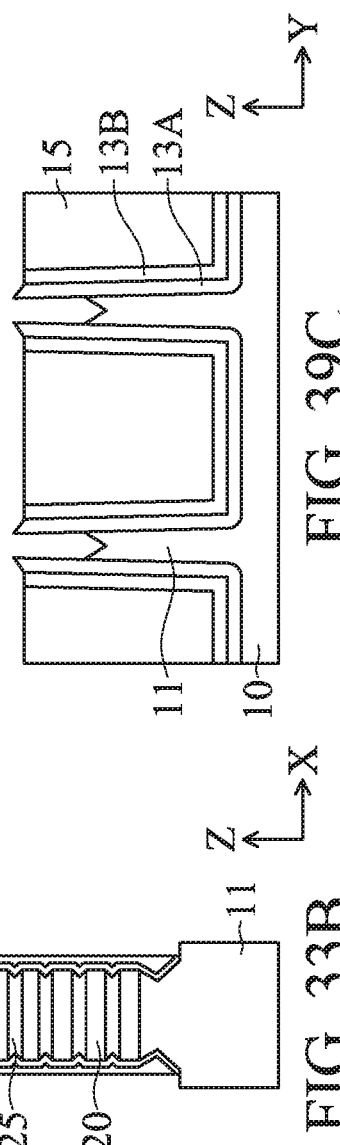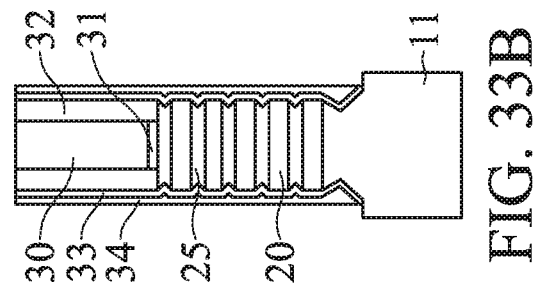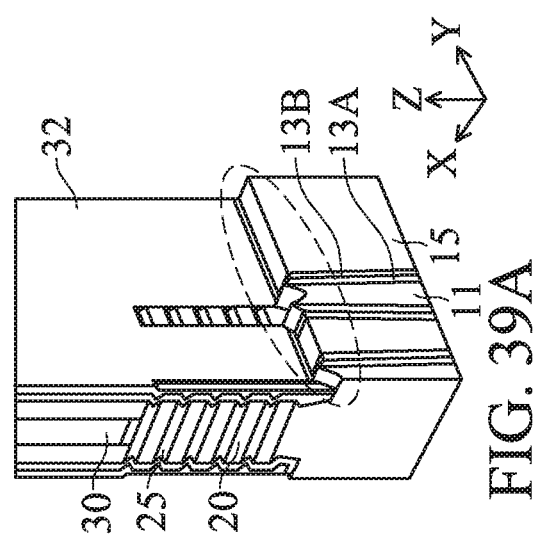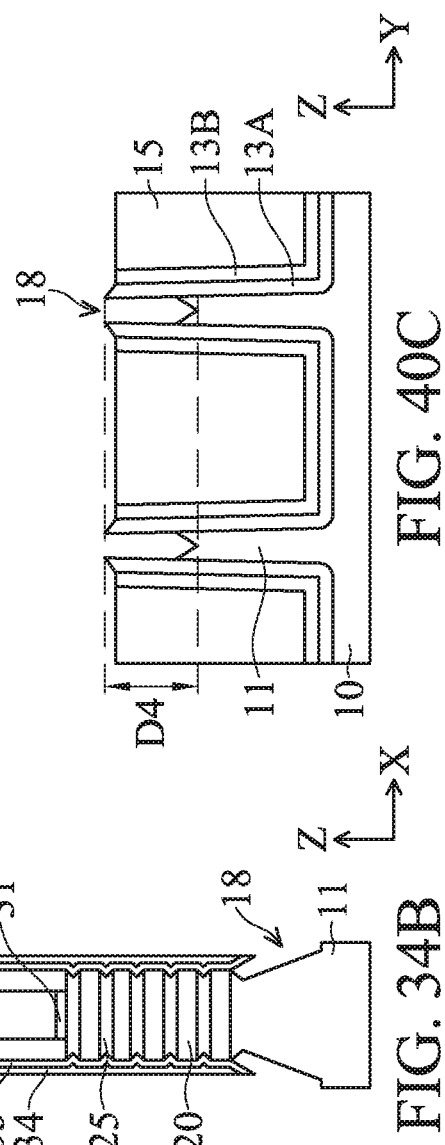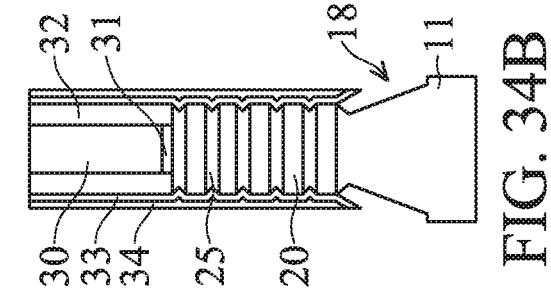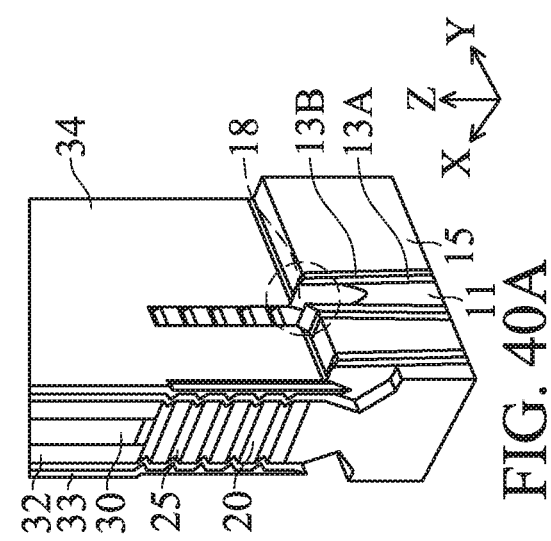

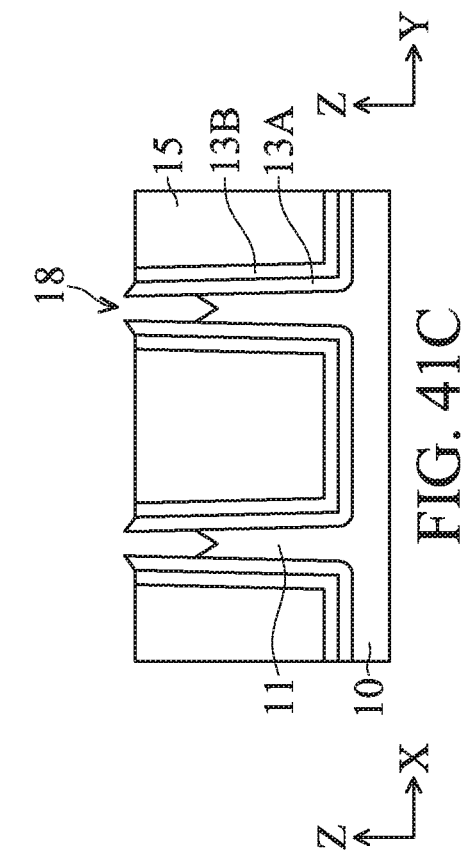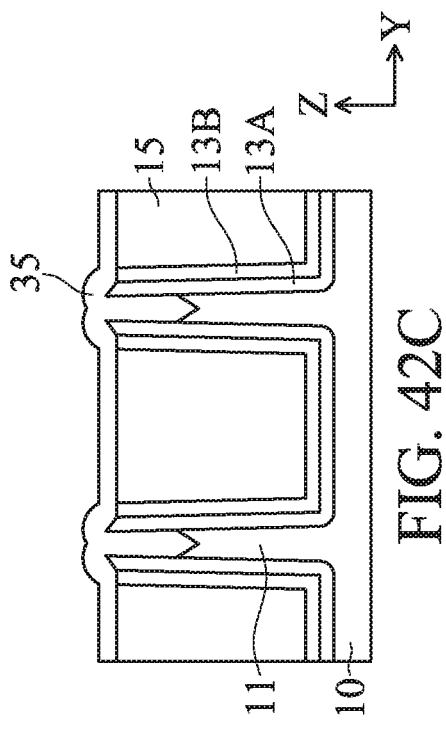
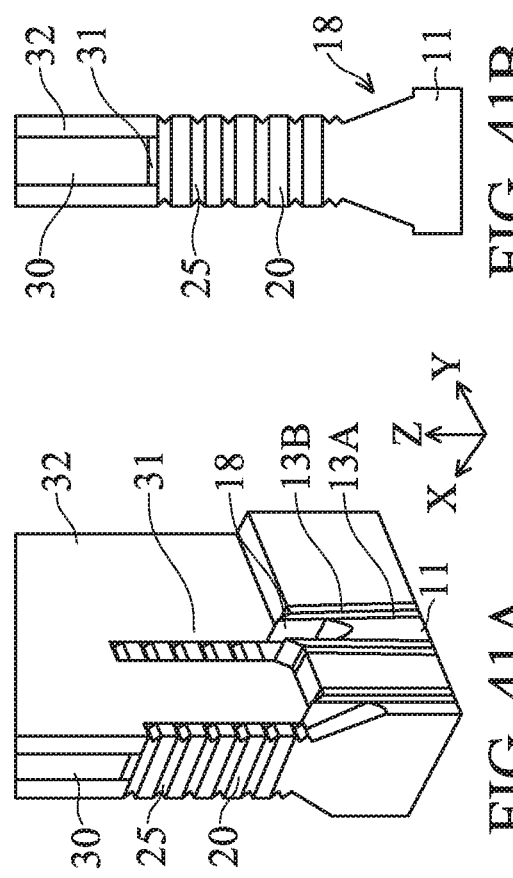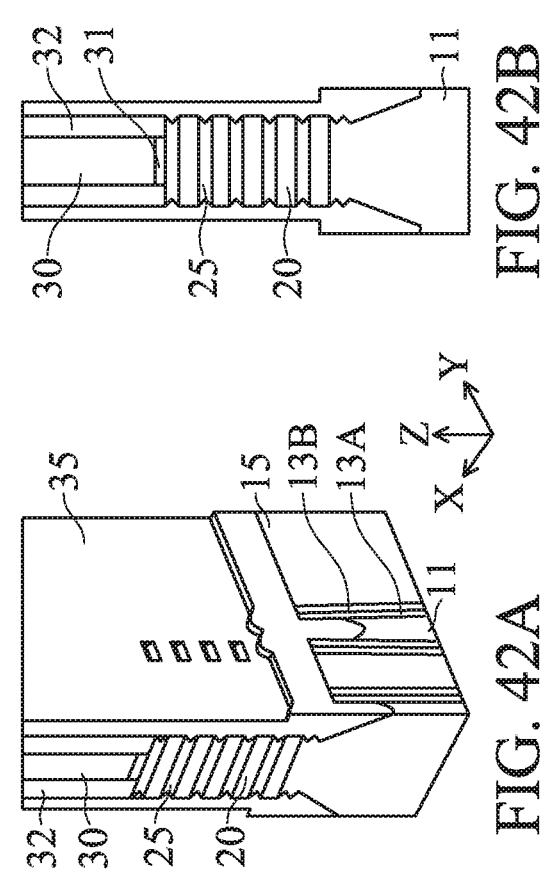

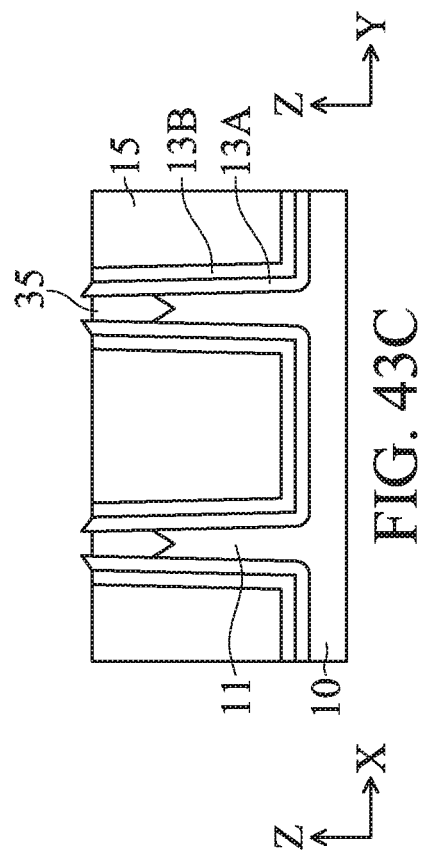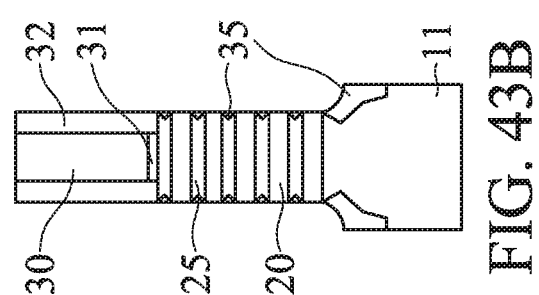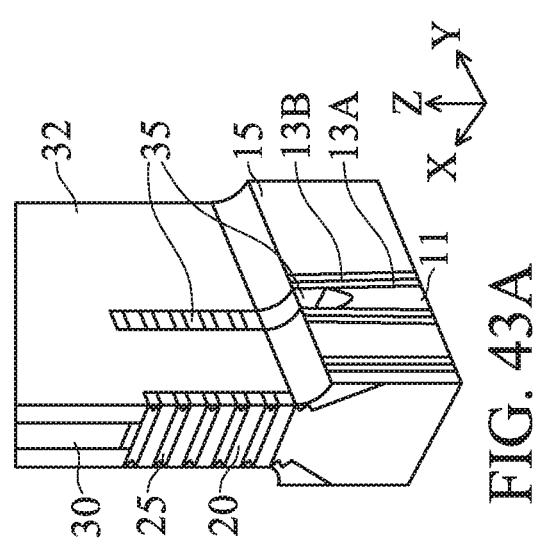
FIG. 43A    FIG. 43B    FIG. 43C
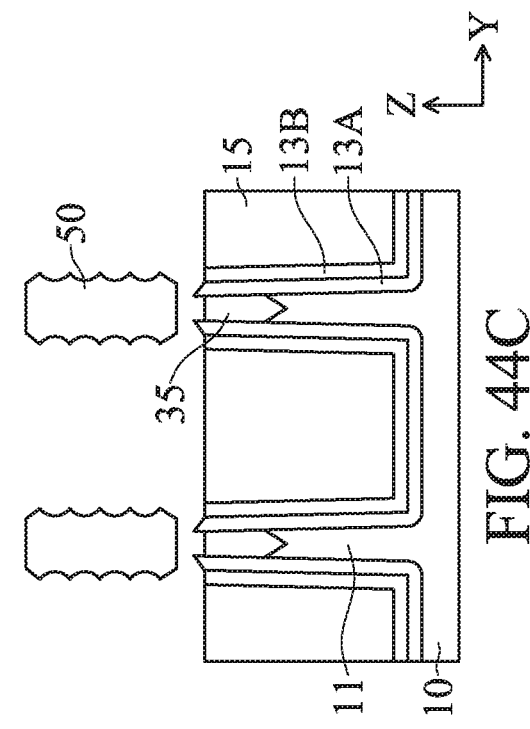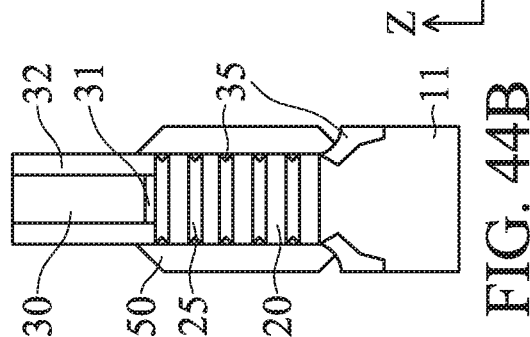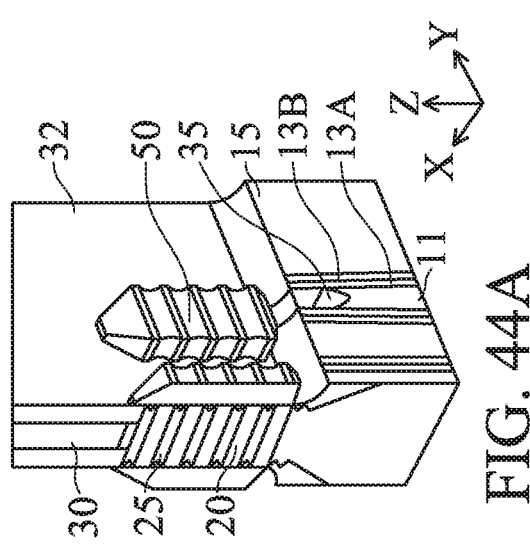
FIG. 44A    FIG. 44B    FIG. 44C

METHOD OF MANUFACTURING A SEMICONDUCTOR DEVICE AND A SEMICONDUCTOR DEVICE

This application claims priority of Provisional Application No. 62/552,895 filed on Aug. 31, 2017, the entire contents of which are incorporated herein by reference.

TECHNICAL FIELD

The disclosure relates to method of manufacturing semiconductor integrated circuits, and more particularly to method of manufacturing semiconductor devices including fin field effect transistors (FinFETs) and/or gate-all-around (GAA) FETs, and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (FinFET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1D and 1E show enlarged cross sectional views corresponding to AR1 of FIGS. 1A and 1B, and FIG. 1F shows an enlarged cross sectional view corresponding to AR2 of FIGS. 1A and 1C.

FIG. 2A shows a perspective view, and FIGS. 2B and 2C show cross sectional views of a semiconductor FET device according to an embodiment of the present disclosure. FIGS. 2D and 2E show enlarged cross sectional views corresponding to AR1 of FIGS. 2A and 2B, and FIG. 2F shows an enlarged cross sectional view corresponding to AR2 of FIGS. 2A and 2C.

FIG. 3A shows a perspective view, and FIGS. 3B and 3C show cross sectional views of a semiconductor FET device according to an embodiment of the present disclosure.

FIG. 4A shows a perspective view, and FIGS. 4B and 4C show cross sectional views of a semiconductor FET device according to an embodiment of the present disclosure.

FIGS. 9A, 9B and 9C show one of the various stages of manufacturing a semiconductor FET device according to an embodiment of the present disclosure.

FIGS. 10A, 10B and 10C show one of the various stages of manufacturing a semiconductor FET device according to an embodiment of the present disclosure.

FIGS. 11A, 11B and 11C show one of the various stages of manufacturing a semiconductor FET device according to an embodiment of the present disclosure.

FIGS. 12A, 12B and 12C show one of the various stages of manufacturing a semiconductor FET device according to an embodiment of the present disclosure.

FIGS. 13A, 13B and 13C show one of the various stages of manufacturing a semiconductor FET device according to an embodiment of the present disclosure.

FIGS. 14A, 14B and 14C show one of the various stages of manufacturing a semiconductor FET device according to an embodiment of the present disclosure.

FIGS. 15A, 15B and 15C show one of the various stages of manufacturing a semiconductor FET device according to an embodiment of the present disclosure.

FIGS. 16A, 16B and 16C show one of the various stages of manufacturing a semiconductor FET device according to an embodiment of the present disclosure.

FIGS. 17A, 17B and 17C show one of the various stages of manufacturing a semiconductor FET device according to an embodiment of the present disclosure.

FIGS. 18A, 18B and 18C show one of the various stages of manufacturing a semiconductor FET device according to an embodiment of the present disclosure.

FIGS. 19A, 19B and 19C show one of the various stages of manufacturing a semiconductor FET device according to an embodiment of the present disclosure.

FIGS. 20A, 20B and 20C show one of the various stages of manufacturing a semiconductor FET device according to an embodiment of the present disclosure.

FIGS. 25A, 25B and 25C show one of the various stages of manufacturing a semiconductor FET device according to another embodiment of the present disclosure.

FIGS. 26A, 26B and 26C show one of the various stages of manufacturing a semiconductor FET device according to another embodiment of the present disclosure.

FIGS. 27A, 27B and 27C show one of the various stages of manufacturing a semiconductor FET device according to another embodiment of the present disclosure.

FIGS. 28A, 28B and 28C show one of the various stages of manufacturing a semiconductor FET device according to another embodiment of the present disclosure.

FIGS. 29A, 29B and 29C show one of the various stages of manufacturing a semiconductor FET device according to another embodiment of the present disclosure.

FIGS. 30A, 30B and 30C show one of the various stages of manufacturing a semiconductor FET device according to another embodiment of the present disclosure.

FIGS. 31A, 31B and 31C show one of the various stages of manufacturing a semiconductor FET device according to another embodiment of the present disclosure.

FIGS. 32A, 32B and 32C show one of the various stages of manufacturing a semiconductor FET device according to another embodiment of the present disclosure.

FIGS. 33A, 33B and 33C show one of the various stages of manufacturing a semiconductor FET device according to another embodiment of the present disclosure.

FIGS. 34A, 34B and 34C show one of the various stages of manufacturing a semiconductor FET device according to another embodiment of the present disclosure.

FIGS. 37A, 37B and 37C show one of the various stages of manufacturing a semiconductor FET device according to another embodiment of the present disclosure.

FIGS. 38A, 38B and 38C show one of the various stages of manufacturing a semiconductor FET device according to another embodiment of the present disclosure.

FIGS. 39A, 39B and 39C show one of the various stages of manufacturing a semiconductor FET device according to another embodiment of the present disclosure.

FIGS. 40A, 40B and 40C show one of the various stages of manufacturing a semiconductor FET device according to another embodiment of the present disclosure.

FIGS. 41A, 41B and 41C show one of the various stages of manufacturing a semiconductor FET device according to another embodiment of the present disclosure.

FIGS. 42A, 42B and 42C show one of the various stages of manufacturing a semiconductor FET device according to another embodiment of the present disclosure.

FIGS. 43A, 43B and 43C show one of the various stages of manufacturing a semiconductor FET device according to another embodiment of the present disclosure.

FIGS. 44A, 44B and 44C show one of the various stages of manufacturing a semiconductor FET device according to another embodiment of the present disclosure.

DETAILED DESCRIPTION

Figures 1A, 1B, 1C:
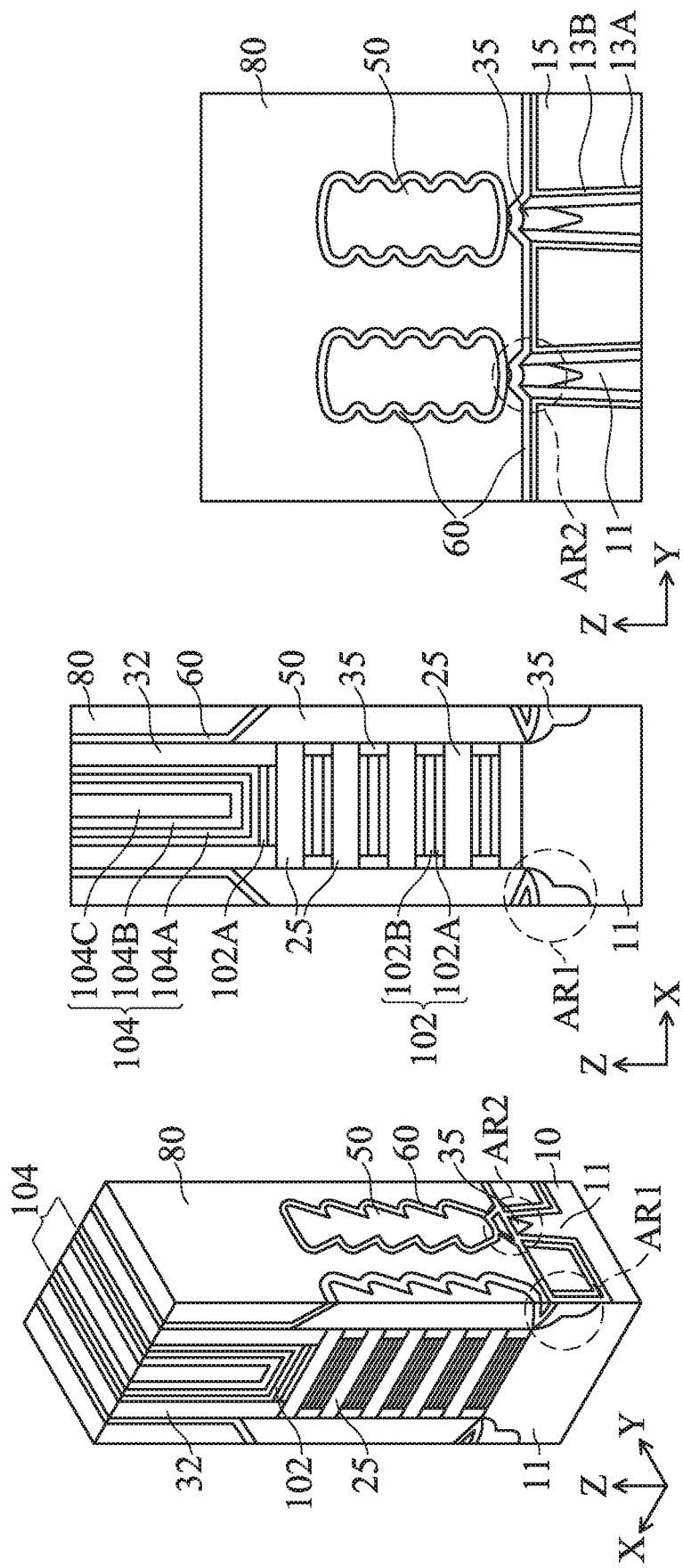
FIG. 1A shows a perspective view.
FIGS. 1B and 1C show cross sectional views of a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A; B; C; A and B; A and C; B and C; or A, B and C), and does not mean one element from A, one element from B and one element from C, unless otherwise described.

A gate-all-around FET (GAA-FET) generally includes one or more semiconductor wires having a channel region and source/drain regions disposed on both ends of the channel region. To manufacture the semiconductor wire(s), stacked layers of different semiconductor materials, one(s) of which is/are a sacrificial layer, are formed, and then the sacrificial layer(s) is/are removed, thereby leaving semiconductor wire(s). In the source/drain regions, a source/drain epitaxial layer is formed to be connected to the channel regions (semiconductor wires). In such a structure, suppressing a leakage current from the source/drain epitaxial layer to the fin structure is an important issue for transistor performances. In some cases, anti-punch through (APT) implantation to the fin structure is used to decrease the leakage current. However, APT impurities may diffuse into the channel region by subsequent thermal processes, which impacts channel mobility and degrades transistor performance.

The present disclosure provides a semiconductor device, such as a GAA FET, which can reduce the leakage current. In this disclosure, a source/drain refers to a source and/or a drain. It is noted that in the present disclosure, a source and a drain are interchangeably used and the structures thereof are substantially the same, unless otherwise described.

FIG. 1A shows a perspective view, and FIGS. 1B and 1C show cross sectional views of an n-type GAA FET device according to an embodiment of the present disclosure.

As shown in FIG. 1, a GAA FET is disposed over a substrate 10. In the GAA FET, semiconductor wires 25 are provided over the semiconductor substrate 10, and vertically arranged along the Z direction (the normal direction of the principal surface of the substrate 10). In some embodiments, the substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

In the GAA FET, the semiconductor wires 25, which are channel layers, are disposed over the substrate 10. In some embodiments, the semiconductor wires 25 are made of Si. In other embodiments, the semiconductor wires 25 are made of $Si_{1-x}Ge_x$, where $0 \leq x \leq 0.3$. In some embodiments, the semiconductor wires 25 are disposed over a fin structure 11 protruding from the substrate 10. The fin structure 11 is embedded in an isolation insulating layer 15. The fin structure 11 is covered by a first fin liner layer 13A and a second fin liner layer 13B disposed over the first fin liner layer 13A. The fin liner layers are made of silicon oxide, SiN or a silicon nitride-based material (e.g., SiON, SiCN or SiOCN).

Each of the channel layers 25 is wrapped around by a gate dielectric layer 102 and a gate electrode layer 104. In some embodiments, the gate dielectric layer 102 includes an interfacial layer 102A and a high-k dielectric layer 102B. The gate structure includes the gate dielectric layer 102, the gate electrode layer 104 and sidewall spacers 32. Although FIG. 1 shows five semiconductor wires 25, the number of the semiconductor wires 25 is not limited to five, and may be as small as one, or more than five and may be up to fifteen (15).

In certain embodiments of the present disclosure, one or more work function adjustment layers 104A and 104B are interposed between the gate dielectric layer 102 and a metal gate electrode layer 104C.

In the GAA FET, a source/drain epitaxial layer 50 is disposed over the fin structure 11. The source/drain epitaxial layer 50 includes one or more layers of Si, SiP, SiC and SiCP for an n-channel FET. The source/drain epitaxial layer 50 is in direct contact with the channel layer 25, and is separated by a dielectric layer 35 as inner spacers and the gate dielectric layer 102 from the gate electrode layer 104. The dielectric layer 35 is made of a low-k (dielectric constant lower than the dielectric constant of $SiO_2$) material in some embodiments. The low-k material includes SiOC, SiOCN, organic material or porous material, or any other suitable material. In other embodiments, the dielectric layer 35 is made of silicon oxide and/or silicon nitride, or any other suitable dielectric material.

Further, a contact etch stop layer (CESL) 60 is formed over the source/drain epitaxial layer 50 and sidewall spacers 32, and an interlayer dielectric (ILD) layer 80 is disposed over the CESL 60. The CESL 60 is made of SiN or a silicon nitride-based material (e.g., SiON, SiCN or SiOCN). The materials for the ILD layer 80 include compounds comprising Si, O, C and/or H, such as silicon oxide, SiCOH and SiOC. Organic materials, such as polymers, may be used for the ILD layer 80.

In the present disclosure, as shown in FIGS. 1A-1C, the semiconductor wires 25 and the source/drain epitaxial layer 50 are disposed above the fin structure 11, and a bottom of the source/drain epitaxial layer 50 is separated from the fin structure 11 by the dielectric layer 35. Further, the same dielectric layer 35 is utilized as an inner spacer between the source/drain epitaxial layer 50 and the gate electrode 104.

Under the source/drain epitaxial layer 50, the upper portion of the fin structure 11 is recessed to have a groove, in which the dielectric layer 35 is disposed. In the present disclosure, the groove has a unique structure.

FIGS. 1D and 1E show enlarged cross sectional views of the groove along the X direction (source to drain direction) corresponding to AR1 of FIGS. 1A and 1B and FIG. 1F shows an enlarged cross sectional view of the groove along the Y direction (gate extending direction) corresponding to AR2 of FIGS. 1A and 1C.

As explained below with reference to FIGS. 5-20C, the groove 18 has a V-shape groove, and in particular has a "double etched profile" caused by two dry etching operations performed at different process steps, as shown in FIGS. 1D and 1E. In some embodiments, as shown in FIG. 1D, the dielectric layer 35 filled in the groove 18 has a height (highest position measured from the bottom of the groove), which corresponds to the interface between the lowest-positioned gate electrode 104 and the lowest-positioned semiconductor wire 25. In other embodiments, the dielectric layer 35 filled in the groove 18 has the height, which corresponds to the bottom of the lowest-positioned gate electrode 104 or lower, as shown in FIG. 1E. The height of the dielectric layer 35 can vary between the cases of FIGS. 1D and 1E. The dielectric layer 35 is connected to the inner spacer formed at the end of the lowest-positioned gate electrode 104.

As shown in FIG. 1E, the groove has a depth D11, which is in a range from about 5 nm to about 50 nm in some embodiments, a top width W11, which is in a range from about 10 nm to about 50 nm in some embodiments, and a bottom width W12, which is in a range from about 1 nm to about 10 nm in some embodiments, all in the X direction. In FIG. 1E, the groove 18 has a step at the middle thereof. The location of the step D12 measured from the top of the groove is in a range from about 2 nm to about 40 nm in some embodiments, and the width W13 at the step is in a range from about 5 nm to about 25 nm in some embodiments. The sidewall of the groove 18 has a wall angle with respect to the Z axis, which changes small-large-small from the bottom of the groove. Even when the dielectric layer 35 filled in the groove 18 has a height lower than the bottom of the lowest-positioned gate electrode 104, the distance W14 between the gate electrode 104 and the dielectric layer 35 is less than about 1 nm. In contrast, in the cross section along the Y direction as shown in FIG. 1F, the groove 18 has a U-shape.

FIG. 2A shows a perspective view, and FIGS. 2B and 2C show cross sectional views of an n-type GAA FET device according to another embodiment of the present disclosure. FIGS. 2D and 2E show enlarged cross sectional views corresponding to AR1 of FIGS. 2A and 2B and FIG. 2F shows an enlarged cross sectional view corresponding to AR2 of FIGS. 2A and 2C. Material, configuration, dimensions and/or processes the same as or similar to the foregoing embodiments described with respect to FIGS. 1A-1F may be employed in the embodiment of FIGS. 2A-2F, and detailed explanation thereof may be omitted.

The gate structure and source/drain structures of the n-type GAA FET shown in FIGS. 2A-2C are substantially the same as those of the n-type GAA FET shown in FIGS. 1A-1C, except for the shape of the groove 18 formed at the upper portion of the fin structure 11.

As explained below with reference to FIGS. 25A-30C, the groove 18 is formed by using wet etching and thus has a (111) facet at the sidewalls thereof, as shown in FIGS. 2D and 2E. In some embodiments, as shown in FIG. 2D, the dielectric layer 35 filled in the groove 18 has a height (highest position measured from the bottom of the groove), which corresponds to the interface between the lowest-positioned gate electrode 104 and the lowest-positioned semiconductor wire 25. In other embodiments, the dielectric layer 35 filled in the groove 18 has the height, which corresponds to the bottom of the lowest-positioned gate electrode 104 or lower, as shown in FIG. 2E. The height of the dielectric layer 35 can vary between the cases of FIGS. 2D and 2E. The dielectric layer 35 is connected to the inner spacer formed at the end of the lowest-positioned gate electrode 104.

As shown in FIG. 2E, the groove has a depth D21, which is in a range from about 5 nm to about 50 nm in some embodiments, a top width W21, which is in a range from about 10 nm to about 50 nm in some embodiments, and a bottom width W22, which is in a range from about 1 nm to about 10 nm in some embodiments, all in the X direction. In FIG. 2E, the groove 18 has a largest width W23 at the middle in the depth direction of the groove 18. Thus, the width of the groove increases and then decreases from the bottom to the top. The largest width W23 is in a range from about 12 nm to about 60 nm in some embodiments. The location D22 of the largest width measured from the top of the groove is in a range from about 2 nm to about 40 nm in some embodiments. Even when the dielectric layer 35 filled in the groove 18 has a height lower than the bottom of the lowest-positioned gate electrode 104, the distance W24 between the gate electrode 104 and the dielectric layer 35 is less than about 1 nm. As set forth above, when the fin structure is formed from a Si substrate having (100) principal surface, the bottom-side sidewalls have a (111) facet of Si. In contrast, in the cross section along the Y direction as shown in FIG. 2F, the groove 18 has a U-shape.

Figure 3E:
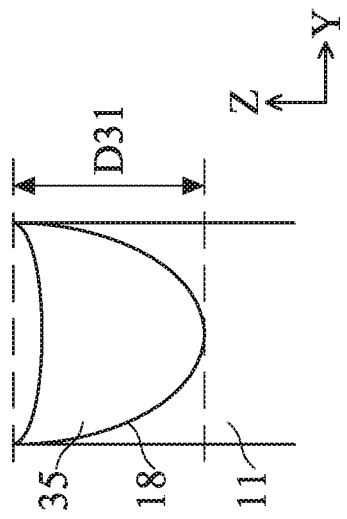
FIG. 3E shows an enlarged cross sectional view corresponding to AR2 of FIGS. 3A and 3C.
Figure 3D:
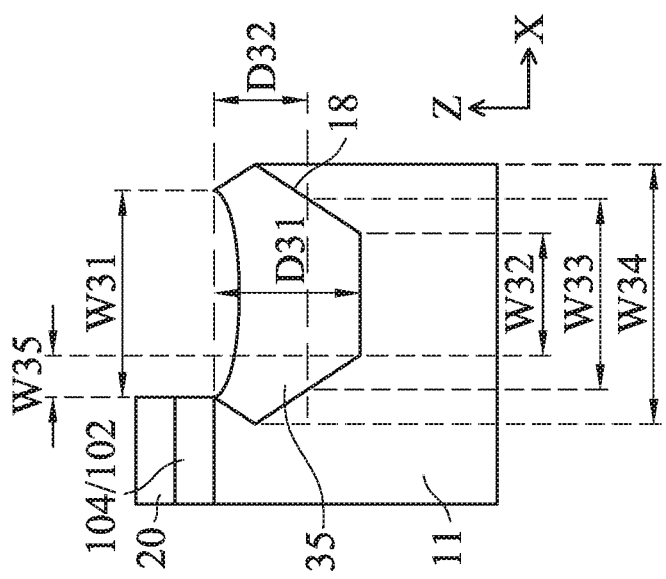
FIG. 3D shows an enlarged cross sectional view corresponding to AR1 of FIGS. 3A and 3B.

FIG. 3A shows a perspective view, and FIGS. 3B and 3C show cross sectional views of a p-type GAA FET device according to another embodiment of the present disclosure. FIG. 3D shows an enlarged cross sectional view corresponding to AR1 of FIGS. 3A and 3B and FIG. 3E shows an enlarged cross sectional view corresponding to AR2 of FIGS. 3A and 3C. Material, configuration, dimensions and/or processes the same as or similar to the foregoing embodiments described with respect to FIGS. 1A-2F may be employed in the embodiment of FIGS. 3A-3E, and detailed explanation thereof may be omitted.

In the p-type GAA FET, the channel layers are formed by semiconductor wires 20, which are made of a semiconductor material different from the substrate 10 and/or the fin structure 11. In some embodiments, the semiconductor wires are made of $Si_{1-x}Ge_x$, where $0.2 \leq x \leq 0.8$. The source/drain epitaxial layer 50 includes one or more layers of Si, SiGe or Ge for a p-channel FET.

As explained below with reference to FIGS. 31A-38C, the groove 18 has a "double etched profile" caused by two dry etching operations performed at different process steps, as shown in FIG. 3D. As shown in FIG. 3D, the groove has a depth D31, which is in a range from about 5 nm to about 50 nm in some embodiments, a top width W31, which is in a range from about 10 nm to about 50 nm in some embodiments, and a bottom width W32, which is in a range from about 1 nm to about 10 nm in some embodiments, all in the X direction.

In FIG. 3D, the groove 18 has a step at the middle thereof. The location D32 of the step measured from the top of the groove is in a range from about 2 nm to about 40 nm in some embodiments, and the width W33 at the step is in a range from about 5 nm to about 25 nm in some embodiments. The sidewall of the groove 18 has a wall angle with respect to the Z axis, which changes small-large-small from the bottom of the groove. In some embodiments, the groove 18 has a largest width W34 near the bottom of the gate electrode layer 104, which is in a range from about 12 nm to about 60 nm. The distance W35 between the bottom-most channel layer 20 and the dielectric layer 35 is less than about 1 nm. In contrast, in the cross section along the Y direction as shown in FIG. 3E, the groove 18 has a U-shape.

Figure 4E:
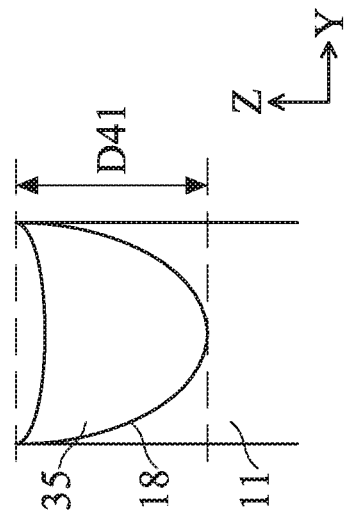
FIG. 4E shows an enlarged cross sectional view corresponding to AR2 of FIGS. 4A and 4C.
Figure 4D:
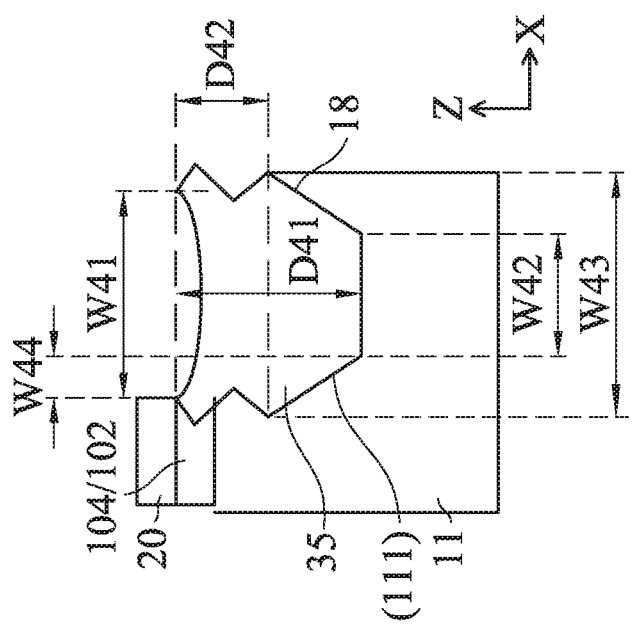
FIG. 4D shows an enlarged cross sectional view corresponding to AR1 of FIGS. 4A and 4B.

FIG. 4A shows a perspective view, and FIGS. 4B and 4C show cross sectional views of a p-type GAA FET device according to another embodiment of the present disclosure. FIG. 4D shows an enlarged cross sectional view corresponding to AR1 of FIGS. 4A and 4B and FIG. 4E shows an enlarged cross sectional view corresponding to AR2 of FIGS. 4A and 4C. Material, configuration, dimensions and/or processes the same as or similar to the foregoing embodiments described with respect to FIGS. 1A-3E may be employed in the embodiment of FIGS. 4A-4E, and detailed explanation thereof may be omitted.

The gate structure and source/drain structures of the p-type GAA FET shown in FIGS. 4A-4C are substantially the same as those of the p-type GAA FET shown in FIGS. 3A-3C, except for the shape of the groove 18 formed at the upper portion of the fin structure 11. As explained below with reference to FIGS. 39A-44C, the groove 18 is formed by using wet etching and thus has a (111) facet at the sidewalls thereof, as shown in FIGS. 4D and 4E.

As shown in FIG. 4D, the groove has a depth D41, which is in a range from about 5 nm to about 50 nm in some embodiments, a top width W41, which is in a range from about 10 nm to about 50 nm in some embodiments, and a bottom width W42, which is in a range from about 1 nm to about 10 nm in some embodiments, all in the X direction. In FIG. 4D, the groove 18 has a largest width W43 at the middle in the depth direction of the groove 18. Thus, the width of the groove increases and then decreases from the bottom to the top. In some embodiments, the width of the groove, from the bottom to the top, increases, decreases, increases and then decreases. The largest width W43 is in a range from about 12 nm to about 60 nm in some embodiments. The location D42 of the largest with measured from the top of the groove is in a range from about 2 nm to about 40 nm in some embodiments. The distance W44 between the bottom-most channel layer 20 and the dielectric layer 35 is less than about 1 nm. As set forth above, when the fin structure is formed from a Si substrate having (100) principal surface, the bottom-side sidewalls have a (111) facet of Si. In contrast, in the cross section along the Y direction as shown in FIG. 4E, the groove 18 has a U-shape.

FIGS. 5-24 show various stages of manufacturing a GAA FET device according to an embodiment of the present disclosure. It is understood that additional operations can be provided before, during, and after the processes shown by FIGS. 5-24, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-4E may be employed in the embodiment of FIGS. 5-24, and detailed explanation thereof may be omitted. In FIGS. 9A-20C, the "A" figures (FIGS. 9A, 10A, . . . ) are perspective views, the "B" figures (FIGS. 9B, 10B, . . . ) are cross sectional views cutting a channel region along the X direction, and the "C" figures (FIGS. 9C, 10C, . . . ) are cross sectional views at a source/drain region along the Y direction. In this embodiment, a manufacturing operation for an n-type GAA FET will be explained.

Figure 5:
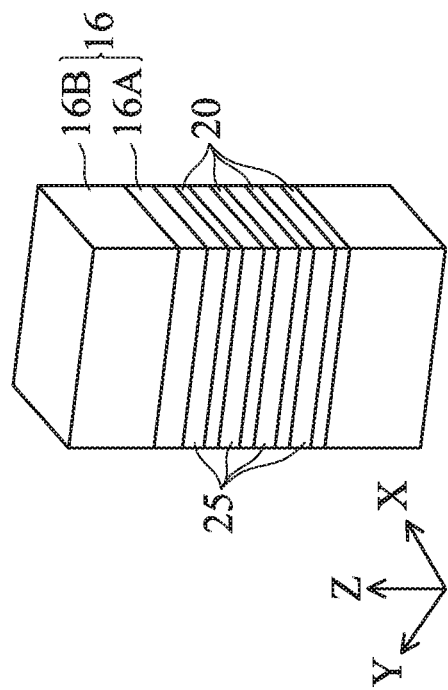
FIG. 5 shows one of the various stages of manufacturing a semiconductor FET device according to an embodiment of the present disclosure.

As shown in FIG. 5, impurity ions (dopants) 12 are implanted into a silicon substrate 10 to form a well region. The ion implantation is performed to prevent a punch-through effect. The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

Figure 6:
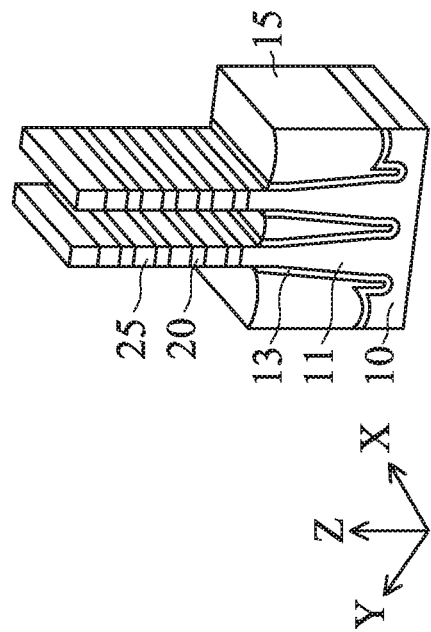
FIG. 6 shows one of the various stages of manufacturing a semiconductor FET device according to an embodiment of the present disclosure.

Then, as shown in FIG. 6, stacked semiconductor layers are formed over the substrate 10. The stacked semiconductor layers include first semiconductor layers 20 and second semiconductor layers 25. Further, a mask layer 16 is formed over the stacked layers.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.2, or Ge (x=1.0) and the second semiconductor layers 25 are Si or $Si_{1-y}Ge_y$, where y is less than about 0.4, and x>y. In this disclosure, an "M" compound" or an "M based compound" means the majority of the compound is M.

In another embodiment, the second semiconductor layers 25 are $Si_{1-y}Ge_y$, where y is more than about 0.2, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.2 to about 0.8, and the second semiconductor layer 25 is made of $Si_{1-y}Ge_y$, where y is in a range from about 0.1 to about 0.4.

In FIG. 6, four layers of the first semiconductor layer 20 and four layers of the second semiconductor layer 25 are disposed. However, the number of the layers are not limited to four, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 2 nm to about 20 nm in some embodiments, and is in a range from about 5 nm to about 15 nm in other embodiments. The thickness of the second semiconductor layers 25 is in a range from about 2 nm to about 20 nm in some embodiments, and is in a range from about 5 nm to about 15 nm in other embodiments. The thickness of each of the first semiconductor layers 20 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 16 includes a first mask layer 16A and a second mask layer 16B. The first mask layer 16A is a pad oxide layer made of a silicon oxide, which can be formed by a thermal oxidation. The second mask layer 16B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 16 is patterned into a mask pattern by using patterning operations including photo-lithography and etching.

Figure 7:
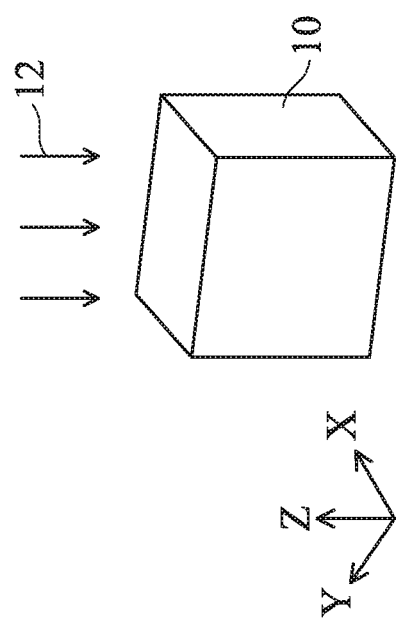
FIG. 7 shows one of the various stages of manufacturing a semiconductor FET device according to an embodiment of the present disclosure.

Next, as shown in FIG. 7, the stacked layers of the first and second semiconductor layers 20, 25 are patterned by using the patterned mask layer 16, thereby the stacked layers are formed into fin structures 29 extending in the X direction. In FIG. 7, two fin structures 29 are arranged in the Y direction. But the number of the fin structures is not limited to two, and may be as small as one and three or more. In some embodiments, one or more dummy fin structures are formed on both sides of the fin structures 29 to improve pattern fidelity in the patterning operations. As shown in FIG. 7 the fin structures 29 have upper portions constituted by the stacked semiconductor layers 20, 25 and well portions 11.

The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

The stacked fin structure 29 may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the stacked fin structure 29.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, a fin liner layer 13 is formed over the fin structures before forming the insulating material layer. The fin liner layer 13 is made of SiN or a silicon nitride-based material (e.g., SiON, SiCN or SiOCN).

In some embodiments, the fin liner layers 13 include a first fin liner layer formed over the substrate 10 and sidewalls of the bottom part of the fin structures 11, and a second fin liner layer formed on the first fin liner layer. Each of the liner layers has a thickness between about 1 nm and about 20 nm in some embodiments. In some embodiments, the first fin liner layer includes silicon oxide and has a thickness between about 0.5 nm and about 5 nm, and the second fin liner layer includes silicon nitride and has a thickness between about 0.5 nm and about 5 nm. The liner layers may be deposited through one or more processes such as physical vapor deposition (PVD), chemical vapor deposition (CVD), or atomic layer deposition (ALD), although any acceptable process may be utilized.

Figure 8:
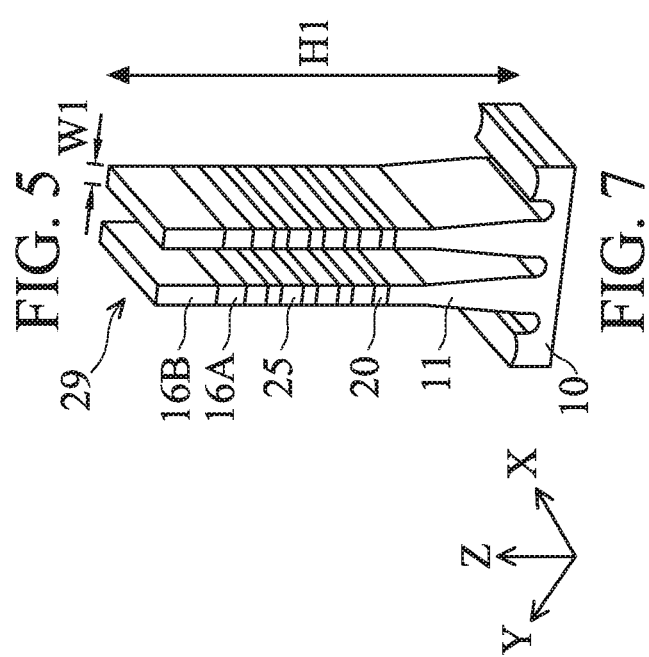
FIG. 8 shows one of the various stages of manufacturing a semiconductor FET device according to an embodiment of the present disclosure.

Then, as shown in FIG. 8, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In the embodiment shown in FIG. 8, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of an n-type GAA FET. In other embodiments, the second semiconductor layers 25 are sacrificial layers which are subsequently partially removed, and the first semiconductor layers 20 are subsequently formed into semiconductor wires as channel layers of a p-type GAA FET.

FIGS. 9A, 9B and 9C show one of the various stages of manufacturing a semiconductor FET device according to an embodiment of the present disclosure. After the isolation insulating layer 15 is formed, a sacrificial (dummy) gate structure 38 is formed, as shown in FIGS. 9A-9C. FIGS. 9A-9C illustrate a structure after a sacrificial gate structure 38 is patterned over the exposed fin structures 29. The sacrificial gate structure 38 is formed over a portion of the fin structures which is to be a channel region. The sacrificial gate structure 38 defines the channel region of the GAA FET. The sacrificial gate structure 38 includes a sacrificial gate dielectric layer 31 and a sacrificial gate electrode layer 30. The sacrificial gate dielectric layer 31 includes one or more layers of insulating material, such as a silicon oxide-based material. In one embodiment, silicon oxide formed by CVD is used. The thickness of the sacrificial gate dielectric layer 31 is in a range from about 1 nm to about 5 nm in some embodiments.

The sacrificial gate structure 38 is formed by first blanket depositing the sacrificial gate dielectric layer 31 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer and a silicon oxide mask layer in some embodiments.

Next, a patterning operation is performed on the mask layer and sacrificial gate electrode layer is patterned into the sacrificial gate electrode 30, as shown in FIGS. 9A and 9B. The sacrificial gate structure includes the sacrificial gate dielectric layer 31, the sacrificial gate electrode layer 30 (e.g., poly silicon), the pad SiN layer and the silicon oxide mask layer (not shown). In some embodiments, the source/drain regions of the fin structures are covered by the sacrificial gate dielectric layer 31. In FIGS. 9A-9C, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Then, the sacrificial gate dielectric layer 31 covering the source/drain regions of the fin structures is removed by dry and/or wet etching, as shown in FIGS. 10A-10C. By this operation, the stacked layers of the first and second semiconductor layers are partially exposed on opposite sides of the sacrificial gate structure 38.

Further, a cover layer for sidewall spacers 32 is conformally formed over the sacrificial gate structure 38, as shown in FIGS. 11A-11C. The cover layer 32 is deposited in a conformal manner so that it is formed to have substantially equal thicknesses on vertical surfaces, such as the sidewalls, horizontal surfaces, and the top of the sacrificial gate structure, respectively. In some embodiments, the cover layer 32 has a thickness in a range from about 5 nm to about 20 nm. The cover layer 32 includes one or more of SiN, SiON and SiCN or any other suitable dielectric material. The cover layer 32 can be formed by ALD or CVD, or any other suitable method.

Next, as shown in FIGS. 12A-12C, the source/drain regions of the stacked fin structures are etched down below the upper surface of the isolation insulating layer 15 by using one or more lithography and etching operations. One or more etching operations are performed to remove the fin sidewall spacer 32 and then to remove the stacked structures of the first and second semiconductor layers and a part of the upper portion of the fin structure 11.

Subsequently, as shown in FIGS. 13A-13C, the first semiconductor layers 20 are laterally etched in the X direction. The amount of etching of the first semiconductor layer 20 is in a range from about 2 nm to about 10 nm in some embodiments. When the first semiconductor layers 20 are Ge or SiGe and the second semiconductor layers 25 are Si, the first semiconductor layers 20 can be selectively etched by using a wet etchant such as, but not limited to, ammonium hydroxide (NH₄OH), tetramethylammonium hydroxide (TMAH), ethylenediamine pyrocatechol (EDP), or potassium hydroxide (KOH) solutions.

Then, as shown in FIGS. 14A-14C, a protective layer is formed to cover the structures shown by FIGS. 13A-13C. The protective layer includes a first protective layer 33 made of a silicon oxide based dielectric material (e.g., SiO₂) and a second protective layer 34 made of a silicon nitride based dielectric material (e.g., SiN, SiON). The first and second protective layers can be formed through a process such as CVD or ALD or any other suitable method. The thickness of the first protective layer 33 is in a range from about 1 nm to about 5 nm and the thickness of the second protective layer 34 is in a range from about 2 nm to about 10 nm in some embodiments.

After the protective layers are formed, anisotropic etching is performed to remove the protective layers at least from the upper portion of the fin structure 11, while the protective layers cover the lateral ends of the first and second semiconductor layers, as shown in FIGS. 15A-15C.

Then, an additional dry etching is performed on the exposed upper portion of the fin structure to deepen the depth of the groove 18, as shown in FIGS. 16A-16C. The depth D1 of the groove measured from the upper surface of the isolation insulating layer 15 is in a range from about 5 nm to about 50 nm in some embodiments. Since the upper portion of the fin structure at the source/drain regions is subjected to at least two dry etching operations, the groove 18 has a step at the middle of the groove 18, as shown in FIGS. 1D and 1E.

After the groove 18 is formed, the second protective layer 34 and the first protective layer 33 are removed by appropriate etching operations, as shown in FIGS. 17A-17C.

Then, a dielectric layer 35 is formed, as shown in FIGS. 18A-18C, to fill the groove 18 and to cover the surrounding portions and the lateral ends of the first and second semiconductor layers. In particular, the dielectric layer 35 is formed on the lateral ends of the first semiconductor layers, which have been laterally etched. The dielectric layer 35 is made of suitable dielectric materials such as silicon oxide, silicon oxynitride, silicon nitride, fluorine-doped silicate glass (FSG), low-k dielectrics such as carbon doped oxides (SiOC, SiOCN), extremely low-k dielectrics such as porous carbon doped silicon dioxide, a polymer such as polyimide, combinations of these, or the like. In some embodiments, the dielectric layer 35 includes one or more layers of low-k dielectric material. The dielectric layer 35 can be formed through a process such as CVD, flowable CVD (FCVD), ALD, or a spin-on-glass process, although any acceptable process may be utilized.

In some embodiments, before forming the dielectric layer 35, an insulating layer is conformally formed on the lateral ends of the first semiconductor layer 20 and on the second semiconductor layer 25. The insulating layer functions as an etch-stop layer in the subsequent channel formation operations. The insulating layer includes one of silicon nitride (SiN) and silicon oxide (SiO₂), and has a thickness in a range from about 0.5 nm to about 3.0 nm. In other embodiments, the insulating layer has a thickness in a range from about 1.0 nm to about 2.0 nm. The insulating layer can be formed by ALD or any other suitable method.

After the dielectric layer 35 is formed, one or more etching operations are performed to remove unnecessary portion of the dielectric layer 35 as shown in FIGS. 19A-19C. By this etching operation, inner spacers are formed on the lateral ends of the first semiconductor layers 20, which have been laterally etched, and dielectric spacers are formed in the grooves 18 and on the surface of surrounding portion of the isolation insulating layer 15. Further, by this etching, the lateral ends of the second semiconductor layer 25 are exposed.

Figure 20D:
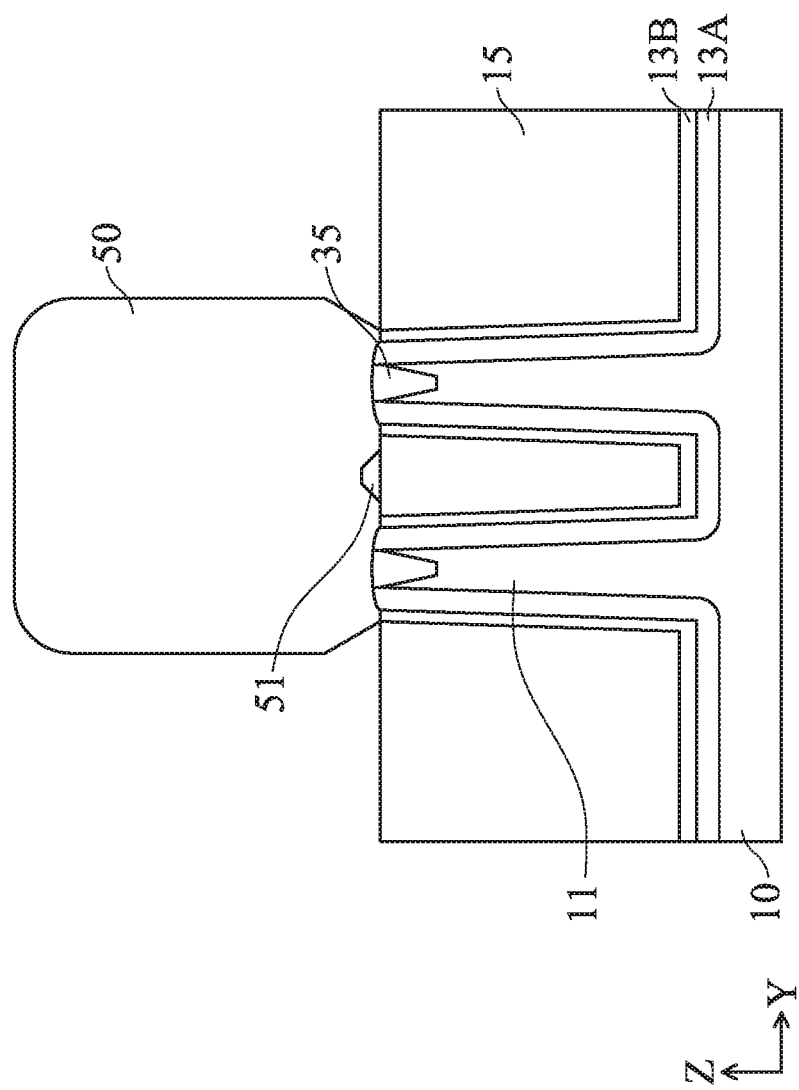
FIG. 20D shows one of the various stages of manufacturing a semiconductor FET device according to another embodiment of the present disclosure.

Subsequently, a source/drain epitaxial layer 50 is formed, as shown in FIGS. 20A-20C. The source/drain epitaxial layer 50 includes one or more layers of Si, SiP, SiC and SiCP for an n-channel FET. The source/drain epitaxial layer 50 is formed by an epitaxial growth method using CVD, ALD or molecular beam epitaxy (MBE). As shown in FIGS. 20A-20C, the source/drain epitaxial layer 50 is formed individually above each corresponding to fin structure 11 in some embodiments. In other embodiments, as shown in FIG. 20D, the adjacent source/drain epitaxial layers 50 merge to form a merged source/drain epitaxial layer 50 with a void 51.

As shown in FIGS. 20A-20D, a bottom of the source/drain epitaxial layer 50 is separated from the fin structure 11 by the dielectric layer 35. Further, the inner spacers 35 made of the same material as the dielectric layer 35 are disposed between the source/drain epitaxial layer 50 and the lateral ends of the first semiconductor layer 20.

FIGS. 21-24 show operations for manufacturing a metal gate structure by a gate-replacement technology. In FIGS. 21-24, a merged source/drain structure similar to FIG. 20D is employed for the explanation purpose, but the individual source/drain epitaxial layer structure as shown in FIGS. 20A-20C can be applied in the operations of FIGS. 21-24.

Figure 21:
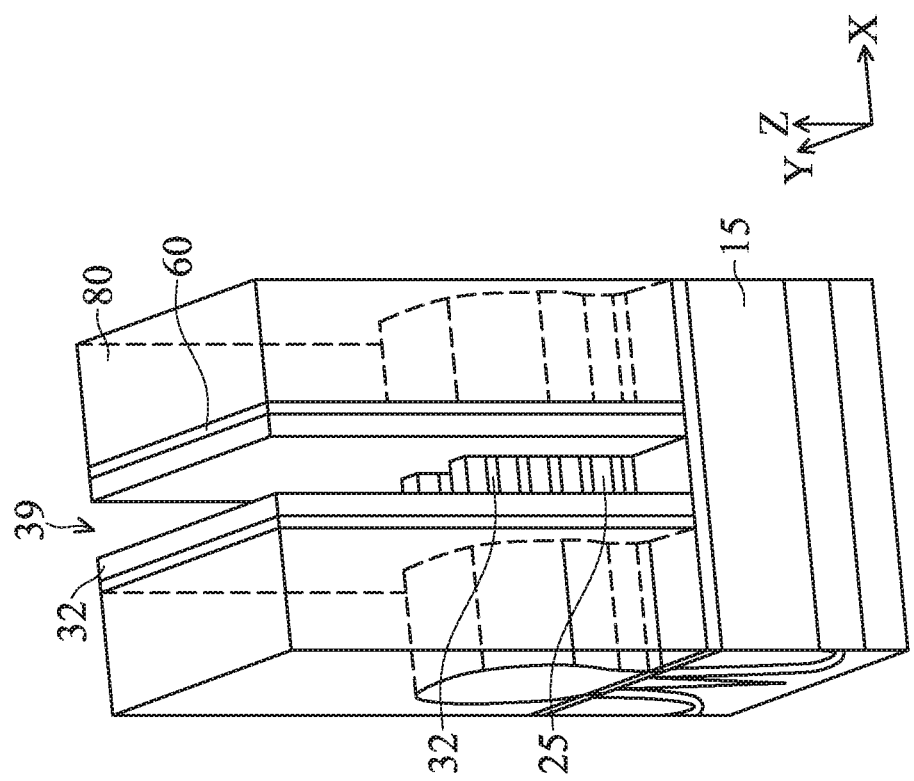
FIG. 21 shows one of the various stages of manufacturing a semiconductor FET device according to an embodiment of the present disclosure.

After the source/drain epitaxial layer 50 is formed, a contact etch stop layer (CESL) 60 is formed over the isolation insulating layer 15, sidewall spacers 32 and the source/drain epitaxial layer 50, and an interlayer dielectric (ILD) layer 80 is formed over the CESL 60, as shown in FIG. 21. The CESL 60 is made of SiN or a silicon nitride-based material (e.g., SiON, SiCN or SiOCN). The materials for the ILD layer 80 include compounds comprising Si, O, C and/or H, such as silicon oxide, SiCOH and SiOC. Organic materials, such as polymers, may be used for the ILD layer 80. The CESL 60 can be formed by CVD, ALD or any other suitable film formation methods. The ILD layer 80 can be formed by CVD, flowable CVD or any other suitable film formation methods. An anneal operation may be performed after the formation of the ILD layer. After the ILD layer 80 is formed, a planarization operation, such as CMP, is performed, so that the top portion of the sacrificial gate electrode layer 30 is exposed.

Figure 22:
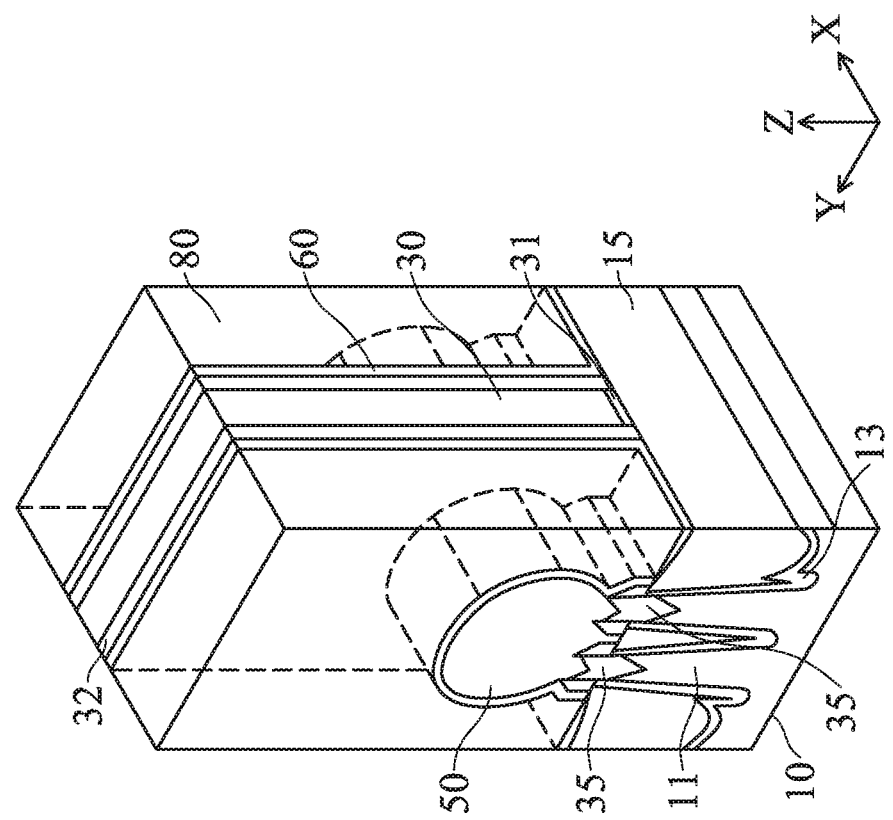
FIG. 22 shows one of the various stages of manufacturing a semiconductor FET device according to an embodiment of the present disclosure.

Then, the sacrificial gate structure 38 including the sacrificial electrode layer 30 and sacrificial gate dielectric layer 31 are removed, thereby forming a gate space 39, as shown in FIG. 22. The ILD layer 80 protects the source/drain epitaxial layer 50 during the removal of the sacrificial gate structures. The sacrificial gate structures can be removed using plasma dry etching and/or wet etching. When the sacrificial gate electrode layer 30 is polysilicon and the ILD layer 36 is silicon oxide, a wet etchant such as a TMAH solution can be used to selectively remove the sacrificial gate electrode layer 30. The sacrificial gate dielectric layer 31 is thereafter removed using plasma dry etching and/or wet etching.

Figure 23:
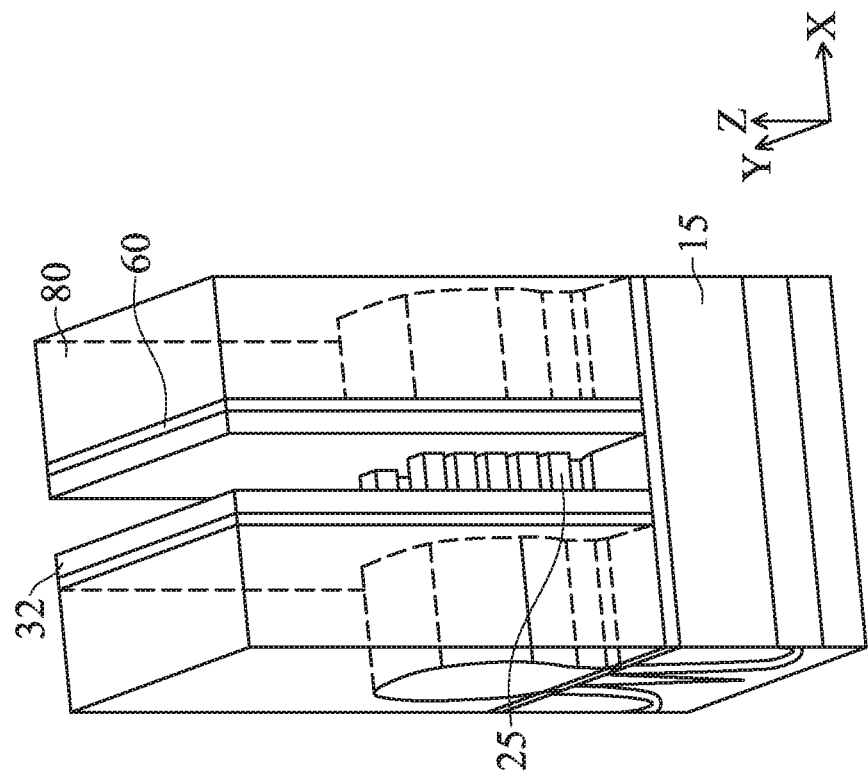
FIG. 23 shows one of the various stages of manufacturing a semiconductor FET device according to an embodiment of the present disclosure.

After the sacrificial gate structures are removed, the first semiconductor layers 20 are removed, thereby forming wires of the second semiconductor layers 25, as channel regions, as shown in FIG. 23. The first semiconductor layers 20 can be removed or etched using an etchant that can selectively etch the first semiconductor layers 20 against the second semiconductor layers 25, as set forth above. In some embodiments, when the insulating layer is formed before the dielectric layer 35 is formed, the etching of the first semiconductor layers 20 stops at the insulating layer.

Figure 24:
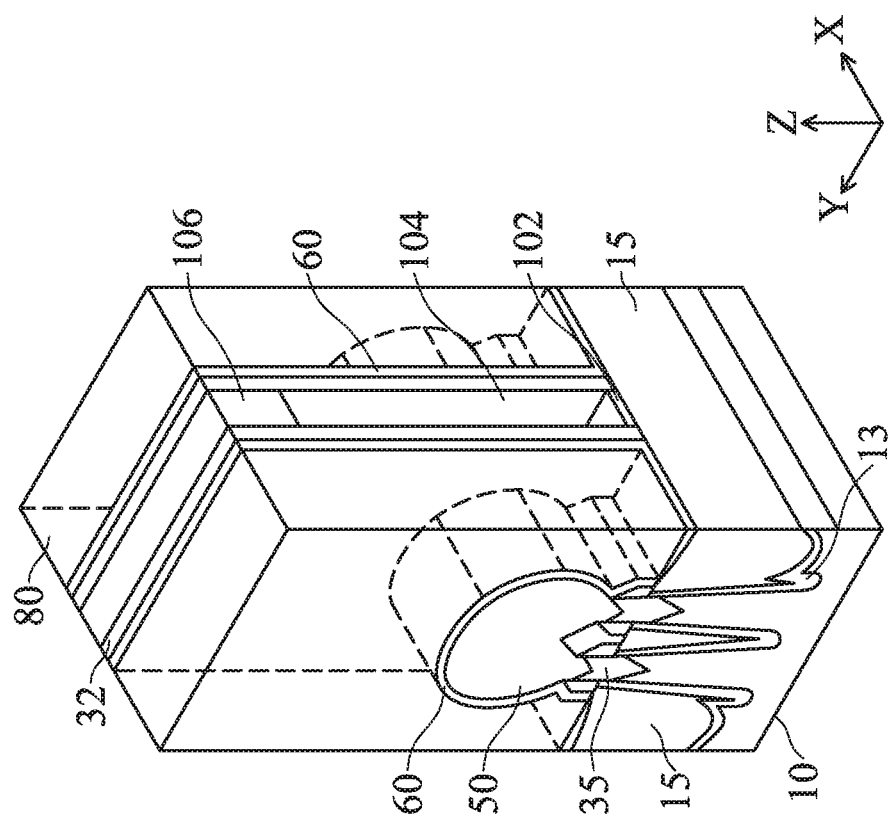
FIG. 24 shows one of the various stages of manufacturing a semiconductor FET device according to an embodiment of the present disclosure.

After the semiconductor wires of the second semiconductor layers 25 are formed, a gate dielectric layer 102 is formed around each channel layers (wires of the second semiconductor layers 25), and a gate electrode layer 104 is formed on the gate dielectric layer 102, as shown in FIG. 24.

In some embodiments, the gate dielectric layer 102 includes an interfacial layer 102A and a high-k dielectric layer 102B (see, FIGS. 1A-1C). The interfacial layer 102A is a chemically formed silicon oxide in some embodiments. In certain embodiments, the high-k gate dielectric layer 102B includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The high-k gate dielectric layer 102B can be formed by CVD, ALD or any suitable method. In one embodiment, the high-k gate dielectric layer 102B is formed using a highly conformal deposition process such as ALD in order to ensure the formation of a gate dielectric layer having a uniform thickness around each channel layers. The thickness of the high-k gate dielectric layer 102B is in a range from about 1 nm to about 6 nm in one embodiment.

The gate electrode layer 104 (a body gate electrode layer) is formed on the gate dielectric layer 102 to surround each channel layer. The gate electrode layer 103 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate electrode layer is also deposited over the upper surface of the ILD layer 80. The gate dielectric layer and the gate electrode layer formed over the ILD layer 80 are then planarized by using, for example, CMP, until the top surface of the ILD layer 80 is revealed. In some embodiments, after the planarization operation, the gate electrode layer 104 is recessed and a cap insulating layer 106 is formed over the recessed gate electrode layer 104. The cap insulating layer includes one or more layers of a silicon nitride-based material, such as SiN. The cap insulating layer 106 can be formed by depositing an insulating material followed by a planarization operation.

In certain embodiments, one or more work function adjustment layers 104A and 104B are interposed between the gate dielectric layer 102 and a body gate electrode layer 104C. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer. The work function adjustment layers may be formed by ALD, PVD, CVD, e-beam evaporation, or other suitable process.

By these operations, the structure shown in FIGS. 1A-1E are obtained. It is understood that the GAA FETs undergoes further CMOS processes to form various features such as contacts/vias, interconnect metal layers, dielectric layers, passivation layers, etc.

FIGS. 25A-30C show various stages of manufacturing a GAA FET device according to another embodiment of the present disclosure. It is understood that additional operations can be provided before, during, and after processes shown by FIGS. 25A-30C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-24 may be employed in the embodiment of FIGS. 25A-30C, and detailed explanation thereof may be omitted. In FIGS. 25A-30C, the "A" figures (FIGS. 25A, 26A, . . . ) are perspective views, the "B" figures (FIGS. 25B, 26B, . . . ) are cross sectional views cutting a channel region along the X direction, and the "C" figures (FIGS. 25C, 25C, . . . ) are cross sectional views at a source/drain region along the Y direction. In this embodiment, a manufacturing operation for an n-type GAA FET will be explained.

FIGS. 25A-25C are the same as FIGS. 15A-15C as set forth above. In this embodiment, the groove 18 is formed by using wet etching, as shown in FIGS. 26A-26C. When the fin structure 11 is made of Si, tetramethylammonium hydroxide (TMAH) can be used as a wet-etchant. Since TMAH anisotropically etches crystalline Si, the sidewalls of the groove 18 have a (111) facet of Si crystal, as shown in FIGS. 2D and 2E. The depth D2 of the groove measured from the upper surface of the isolation insulating layer 15 is in a range from about 5 nm to about 50 nm in some embodiments.

After the groove 18 is formed by wet etching, the second protective layer 34 and the first protective layer 33 are removed by appropriate etching operations, as shown in FIGS. 27A-27C. The operations to remove the protective layers are substantially the same as those explained with respect to FIGS. 17A-17C.

Then, similar to FIGS. 18A-18C, a dielectric layer 35 is formed, as shown in FIGS. 28A-28C, to fill the groove 18 and to cover the surrounding portions and the lateral ends of the first and second semiconductor layers. The operations to form the dielectric layer 35 are substantially the same as those explained with respect to FIGS. 18A-18C.

After the dielectric layer 35 is formed, one or more etching operations are performed to remove unnecessary portions of the dielectric layer 35 as shown in FIGS. 29A-29C. The operations to partially etch the dielectric layer 35 are substantially the same as those explained with respect to FIGS. 19A-19C. By this etching operation, inner spacers are formed on the lateral ends of the first semiconductor layers 20, which have been laterally etched, and dielectric spacers are formed in the grooves 18 and on the surface of surrounding portion of the isolation insulating layer 15. Further, by this etching, the lateral ends of the second semiconductor layer 25 are exposed.

Subsequently, a source/drain epitaxial layer 50 is formed, as shown in FIGS. 30A-30C. The operations to form the source/drain epitaxial layer 50 are substantially the same as those explained with respect to FIGS. 20A-20C.

After the source/drain epitaxial layer 50 is formed, the same as or similar operations explained with respect to FIGS. 21-24 are performed, and the structure shown in FIGS. 2A-2E are obtained. It is understood that the GAA FETs undergoes further CMOS processes to form various features such as contacts/vias, interconnect metal layers, dielectric layers, passivation layers, etc.

FIGS. 31A-38C show various stages of manufacturing a GAA FET device according to another embodiment of the present disclosure. It is understood that additional operations can be provided before, during, and after processes shown by FIGS. 31A-38C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-30C may be employed in the embodiment of FIGS. 31A-38C, and detailed explanation thereof may be omitted. In FIGS. 31A-38C, the "A" figures (FIGS. 31A, 32A, . . . ) are perspective views, the "B" figures (FIGS. 31B, 32B, . . . ) are cross sectional views cutting a channel region along the X direction, and the "C" figures (FIGS. 31C, 32C, . . . ) are cross sectional views at a source/drain region along the Y direction. In this embodiment, a manufacturing operation for a p-type GAA FET will be explained.

After the structure shown in FIGS. 12A-12C is formed, the second semiconductor layers 25 are laterally etched in the X direction, as shown in FIGS. 31A-31C. The amount of etching of the second semiconductor layer 25 is in a range from about 2 nm to about 10 nm in some embodiments. When the first semiconductor layers 20 are Ge or SiGe and the second semiconductor layers 25 are Si, the second semiconductor layers 25 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

Then, as shown in FIGS. 32A-32C, a protective layer formed to cover the structures shown by FIGS. 30A-39C. The operations to form the protective layer are substantially the same as or similar to those explained with respect to FIGS. 14A-14C.

After the protective layers are formed, anisotropic etching is performed to remove the protective layers at least from the upper portion of the fin structure 11, while the protective layers cover the lateral ends of the first and second semiconductor layers, as shown in FIGS. 33A-33C, similar to FIGS. 15A-15C.

Then, an additional dry etching is performed on the exposed upper portion of the fin structure to deepen the depth of the groove 18, as shown in FIGS. 34A-34C. The depth D3 of the groove measured from the upper surface of the isolation insulating layer 15 is in a range from about 5 nm to about 50 nm in some embodiments. Since the upper portion of the fin structure at the source/drain regions is subjected to at least two dry etching operations, the groove 18 has a step at the middle of the groove 18, as shown in FIG. 3D.

Figure 35A:
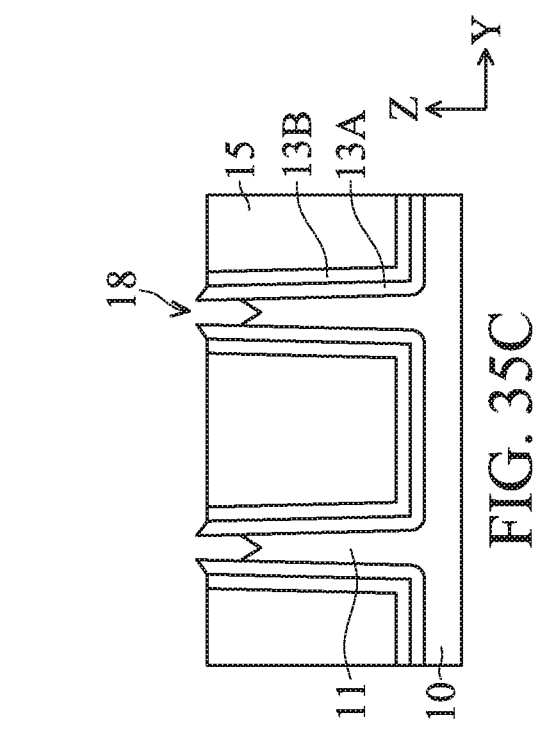
FIGS. 35A, 35B and 35C show one of the various stages of manufacturing a semiconductor FET device according to another embodiment of the present disclosure.
Figure 35B:
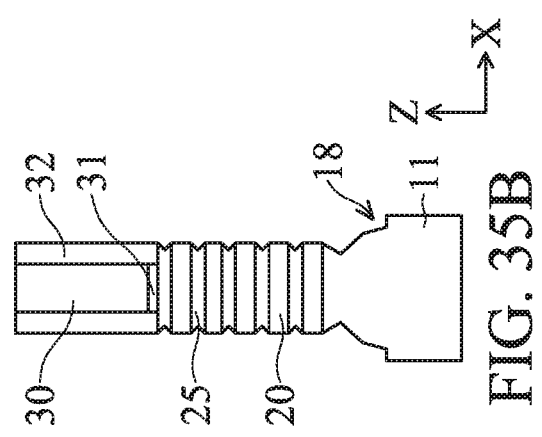
Figure 35C:
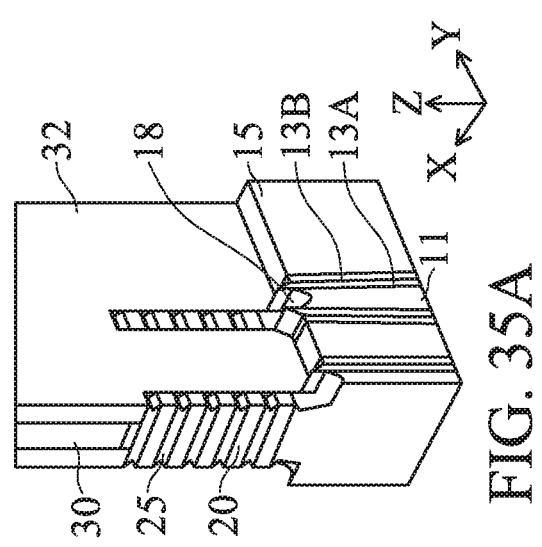

After the groove 18 is formed by wet etching, the second protective layer 34 and the first protective layer 33 are removed by appropriate etching operations, as shown in FIGS. 35A-35C. The operations to remove the protective layers are substantially the same as those explained with respect to FIGS. 17A-17C.

Figure 36A:
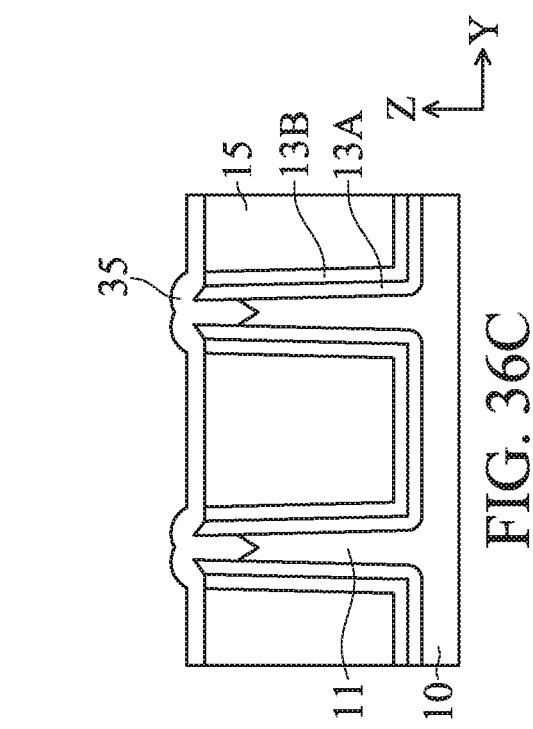
FIGS. 36A, 36B and 36C show one of the various stages of manufacturing a semiconductor FET device according to another embodiment of the present disclosure.
Figure 36B:
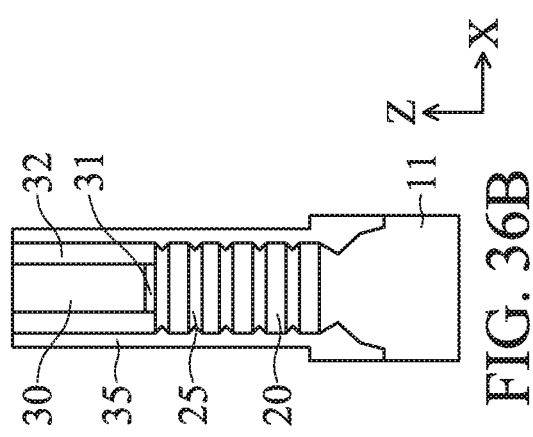
Figure 36C:
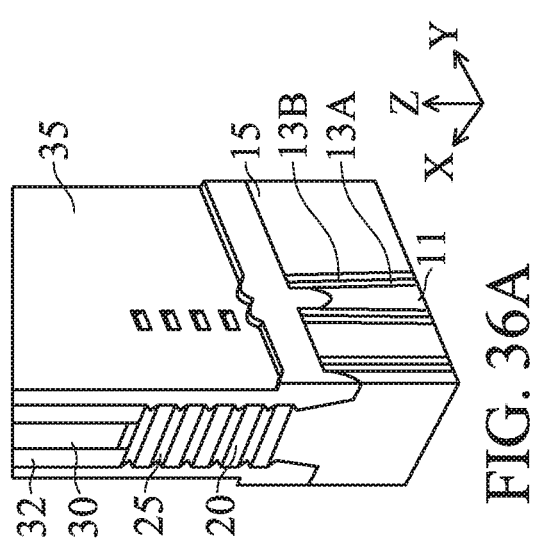

Then, similar to FIGS. 18A-18C, a dielectric layer 35 is formed, as shown in FIGS. 36A-36C, to fill the groove 18 and to cover the surrounding portions and the lateral ends of the first and second semiconductor layers. The operations to form the dielectric layer 35 are substantially the same as those explained with respect to FIGS. 18A-18C.

After the dielectric layer 35 is formed, one or more etching operations are performed to remove unnecessary portion of the dielectric layer 35 as shown in FIGS. 37A-37C. The operations to partially etch the dielectric layer 35 are substantially the same as those explained with respect to FIGS. 19A-19C. By this etching operation, inner spacers are formed on the lateral ends of the second semiconductor layers 25, which have been laterally etched, and dielectric spacers are formed in the grooves 18 and on the surface of surrounding portion of the isolation insulating layer 15. Further, by this etching, the lateral ends of the first semiconductor layer 20 are exposed.

Subsequently, a source/drain epitaxial layer 50 is formed, as shown in FIGS. 38A-38C. The source/drain epitaxial layer 50 includes one or more layers of Si, SiGe or Ge for a p-channel FET. The operations to form the source/drain epitaxial layer 50 are substantially the same as those explained with respect to FIGS. 20A-20C.

After the source/drain epitaxial layer 50 is formed, the same as or similar operations explained with respect to FIGS. 21-24 are performed, and the structure shown in FIGS. 3A-3D are obtained. In the channel formation process explained with respect to FIG. 23, the second semiconductor layers 25 are removed, thereby leaving the first semiconductor layer as channel regions of the GAA FET. Further, in this process, the upper portion of the fin structure 11 below the channel regions is also partially etched, and the gate dielectric layer and the gate electrode layer fill the space formed above the fin structure 11 and the bottom-most first semiconductor layer 20 (see, FIGS. 3A and 3B). Further, the one or more work function adjustment layers 104A and 104B include one or more of TiAlC, Al, TiAl, TaN, TaAlC, TiN, TiC and Co, or any other suitable conductive material.

It is understood that the GAA FETs undergo further CMOS processes to form various features such as contacts/vias, interconnect metal layers, dielectric layers, passivation layers, etc.

FIGS. 39A-43C show various stages of manufacturing a GAA FET device according to another embodiment of the present disclosure. It is understood that additional operations can be provided before, during, and after processes shown by FIGS. 39A-43C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-38C may be employed in the embodiment of FIGS. 39A-43C, and detailed explanation thereof may be omitted. In FIGS. 39A-43C, the "A" figures (FIGS. 39A, 40A, . . . ) are perspective views, the "B" figures (FIGS. 39B, 40B, . . . ) are cross sectional views cutting a channel region along the X direction, and the "C" figures (FIGS. 39C, 40C, . . . ) are cross sectional views at a source/drain region along the Y direction. In this embodiment, a manufacturing operation for a p-type GAA FET will be explained.

FIGS. 39A-39C are the same as FIGS. 33A-33C.

After the protective layers are removed, the groove 18 is formed by using wet etching, as shown in FIGS. 40A-40C, similar to FIGS. 26A-26C. When the fin structure 11 is made of Si, tetramethylammonium hydroxide (TMAH) can be used as a wet-etchant. Since TMAH anisotropically etches crystalline Si, the sidewalls of the groove 18 have a (111) facet of Si crystal, as shown in FIG. 4D. The depth D4 of the groove measured from the upper surface of the isolation insulating layer 15 is in a range from about 5 nm to about 50 nm in some embodiments.

After the groove 18 is formed by wet etching, the second protective layer 34 and the first protective layer 33 are removed by appropriate etching operations, as shown in FIGS. 41A-41C. The operations to remove the protective layers are substantially the same as those explained with respect to FIGS. 17A-17C.

Then, similar to FIGS. 18A-18C, a dielectric layer 35 is formed, as shown in FIGS. 42A-42C, to fill the groove 18 and to cover the surrounding portions and the lateral ends of the first and second semiconductor layers. The operations to form the dielectric layer 35 are substantially the same as those explained with respect to FIGS. 18A-18C.

After the dielectric layer 35 is formed, one or more etching operations are performed to remove unnecessary portion of the dielectric layer 35 as shown in FIGS. 43A-43C. The operations to partially etch the dielectric layer 35 are substantially the same as those explained with respect to FIGS. 19A-19C. By this etching operation, inner spacers are formed on the lateral ends of the second semiconductor layers 25, which have been laterally etched, and dielectric spacers are formed in the grooves 18 and on the surface of surrounding portion of the isolation insulating layer 15. Further, by this etching, the lateral ends of the first semiconductor layer 20 are exposed.

Subsequently, a source/drain epitaxial layer 50 is formed, as shown in FIGS. 44A-44C. The source/drain epitaxial layer 50 includes one or more layers of Si, SiGe or Ge for a p-channel FET. The operations to form the source/drain epitaxial layer 50 are substantially the same as those explained with respect to FIGS. 20A-20C.

After the source/drain epitaxial layer 50 is formed, the same as or similar operations explained with respect to FIGS. 21-24 are performed, and the structure shown in FIGS. 4A-4D are obtained. In the channel formation process explained with respect to FIG. 23, the second semiconductor layers 25 are removed, thereby leaving the first semiconductor layer as channel regions of the GAA FET. Further, in this process, the upper portion of the fin structure 11 below the channel regions is also partially etched, and the gate dielectric layer and the gate electrode layer fill the space formed above the fin structure 11 and the bottom-most first semiconductor layer 20 (see, FIGS. 4A and 4B). Further, the one or more work function adjustment layers 104A and 104B include one or more of TiAlC, Al, TiAl, TaN, TaAlC, TiN, TiC and Co, or any other suitable conductive material.

It is understood that the GAA FETs undergo further CMOS processes to form various features such as contacts/vias, interconnect metal layers, dielectric layers, passivation layers, etc.

The various embodiments or examples described herein offer several advantages over the existing art. For example, in the present disclosure, since a dielectric layer is inserted between the bottom of the source/drain epitaxial layer and the fin structure, it is possible to reduce an off-state leakage current with reducing an amount of APT dose. Further, the inner spacers and the dielectric layer are formed by the same operations, the process to form the inner spacers can be easier.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure, in which first semiconductor layers and second semiconductor layers are alternately stacked, is formed. A sacrificial gate structure is formed over the fin structure. The first semiconductor layers, the second semiconductor layers and an upper portion of the fin structure at a source/drain region of the fin structure, which is not covered by the sacrificial gate structure, are etched. A dielectric layer is formed over the etched upper portion of the fin structure. A source/drain epitaxial layer is formed. The source/drain epitaxial layer is connected to ends of the second semiconductor layers, and a bottom of the source/drain epitaxial layer is separated from the fin structure by the dielectric layer. In one or more of the foregoing and following embodiments, after the first semiconductor layers, the second semiconductor layers and the upper portion of the fin structure are etched, the first semiconductor layers are laterally etched. In one or more of the foregoing and following embodiments, the dielectric layer is also formed on laterally etched ends of the first semiconductor layers. In one or more of the foregoing and following embodiments, after the first semiconductor layers, the second semiconductor layers and the upper portion of the fin structure are etched, the etched upper portion of the fin structure is further etched, while the first and second semiconductor layers are protected by a cover layer. In one or more of the foregoing and following embodiments, the etched upper portion of the fin structure is etched by wet etching. In one or more of the foregoing and following embodiments, after the etched upper portion of the fin structure is etched and before the dielectric layer is formed, the cover layer is removed. In one or more of the foregoing and following embodiments, after the source/drain epitaxial layer is formed, an interlayer dielectric (ILD) layer is formed, the sacrificial gate structure are removed, thereby exposing a part of the fin structure, the first semiconductor layers are removed from the exposed fin structure, thereby forming channel layers including the second semiconductor layers, and a gate dielectric layer and a gate electrode layer are formed around the channel layers. In one or more of the foregoing and following embodiments, a bottom portion of the fin structure is embedded an isolation insulating layer, and the dielectric layer is made of a different material than the isolation insulating layer and the ILD layer. In one or more of the foregoing and following embodiments, the first semiconductor layers are made of $Si_{1-x}Ge_x$ and the second semiconductor layers are made of $Si_{1-y}Ge_y$, where $0 \le x < y < 1$. In one or more of the foregoing and following embodiments, the first semiconductor layers are made of $Si_{1-x}Ge_x$, where $0.2 \le x \le 0.8$, and the second semiconductor layers are made of Si. In one or more of the foregoing and following embodiments, the dielectric layer is made of SiCO or SiOCN. In one or more of the foregoing and following embodiments, the dielectric layer is made of silicon oxide or silicon nitride.

In accordance with another aspect of the present disclosure, in a method of manufacturing a semiconductor device, a fin structure, in which first semiconductor layers and second semiconductor layers are alternately stacked, is formed. A sacrificial gate structure is formed over the fin structure. A sidewall spacer is formed on a side of the sacrificial gate structure. The first semiconductor layers, the second semiconductor layers and an upper portion of the fin structure, which are not covered by the sacrificial gate structure and the sidewall spacer are etched. A cover layer is formed to cover the first semiconductor layers and the second semiconductor layers. The upper portion of the fin structure are etched. A dielectric layer is formed over the etched upper portion of the fin structure. A source/drain epitaxial layer is formed. In one or more of the foregoing and following embodiments, the cover layer includes a silicon oxide layer and a silicon nitride layer. In one or more of the foregoing and following embodiments, after the first semiconductor layers, the second semiconductor layer and the upper portion of the fin structure are etched and before the cover layer is formed, the first semiconductor layers under the sidewall spacer are laterally etched. In one or more of the foregoing and following embodiments, after the etched upper portion of the fin structure is further etched and before the dielectric layer is formed, the cover layer is removed. In one or more of the foregoing and following embodiments, the etched upper portion of the fin structure is etched by wet etching.

In accordance with another aspect of the present disclosure, in a method of manufacturing a semiconductor device, a first fin structure and a second fin structure, in both of which first semiconductor layers and second semiconductor layers are alternately stacked, are formed. A sacrificial gate structure is formed over the first and second fin structure. The first semiconductor layers, the second semiconductor layers and an upper portion of the fin structure at source/drain regions of the first and second fin structures, which are not covered by the sacrificial gate structure, are etched. A dielectric layer is formed over the etched upper portions of the first and second fin structures. A first source/drain epitaxial layer is formed over the first fin structure and a second source/drain epitaxial layer over the second fin structure. A bottom of the first source/drain epitaxial layer is separated from the first fin structure by the dielectric layer, and a bottom of the second source/drain epitaxial layer is separated from the second fin structure by the dielectric layer. In one or more of the foregoing and following embodiments, the first source/drain epitaxial layer is separated from the second source/drain epitaxial layer. In one or more of the foregoing and following embodiments, the first source/drain epitaxial layer is connected to the second source/drain epitaxial layer.

In accordance with one aspect of the present disclosure, a semiconductor device includes semiconductor wires vertically arranged, each of which has a channel region, and a source/drain epitaxial layer connected to ends of the semiconductor wires. The semiconductor wires and the source/drain epitaxial layer are disposed above a fin structure, and a bottom of the source/drain epitaxial layer is separated from the fin structure by a dielectric layer. In one or more of the foregoing and following embodiments, the semiconductor device further includes an isolation insulating layer in which the fin structure is embedded, and an interlayer dielectric (ILD) layer covering the source/drain epitaxial layer. The dielectric layer is made of a different material than the isolation insulating layer and the ILD layer. In one or more of the foregoing and following embodiments, the dielectric layer is made of SiCO or SiOCN. In one or more of the foregoing and following embodiments, the dielectric layer is in contact with the source/drain epitaxial layer and the fin structure. In one or more of the foregoing and following embodiments, an upper surface of the fin structure in contact with the dielectric layer has a V-shaped groove. In one or more of the foregoing and following embodiments, the fin structure is made of Si, and the V-shaped groove includes a (111) crystal facet of Si. In one or more of the foregoing and following embodiments, the semiconductor device further includes a gate structure wrapping around the channel region of each of the semiconductor wires, and inner spacers disposed between the source/drain epitaxial layer and portions of the gate structure arranged between adjacent semiconductor wires. In one or more of the foregoing and following embodiments, the inner spacers are made of a same material as the dielectric layer. In one or more of the foregoing and following embodiments, the semiconductor wires are made of Si. In one or more of the foregoing and following embodiments, the semiconductor wires are made of SiGe and the fin structures are made of Si.

In accordance with another aspect of the present disclosure, a semiconductor device includes a first group of semiconductor wires vertically arranged above a first fin structure, each of which has a channel region, a first source/drain epitaxial layer connected to ends of the semiconductor wires of the first group and disposed above the first fin structure, a second group of semiconductor wires vertically arranged above a second fin structure, each of which has a channel region, and a second source/drain epitaxial layer connected to ends of the semiconductor wires of the second group and disposed above the second fin structure. The first fin structure is adjacent to the second fin structure with an isolation insulating layer interposed between the first and second fin structures. A bottom of the first source/drain epitaxial layer is separated from the first fin structure by a dielectric layer, and a bottom of the second source/drain epitaxial layer is separated from the second fin structure by the dielectric layer. In one or more of the foregoing and following embodiments, the first source/drain epitaxial layer is separated from the second source/drain epitaxial layer. In one or more of the foregoing and following embodiments, the first source/drain epitaxial layer is connected to the second source/drain epitaxial layer. In one or more of the foregoing and following embodiments, the semiconductor device further includes an interlayer dielectric (ILD) layer covering the source/drain epitaxial layer. The dielectric layer is made of a different material than the isolation insulating layer and the ILD layer. In one or more of the foregoing and following embodiments, the dielectric layer is made of SiCO or SiOCN. In one or more of the foregoing and following embodiments, the dielectric layer is made of silicon oxide or silicon nitride.

In accordance with another aspect of the present disclosure, a semiconductor device includes semiconductor wires vertically arranged and extending in a first direction, each of which has a channel region, and a source/drain epitaxial layer connected to ends of the semiconductor wires. The semiconductor wires and the source/drain region are disposed above a fin structure. A bottom of the source/drain epitaxial layer is separated from the fin structure by a dielectric layer. The dielectric layer is in contact with the fin structure, and an upper surface of the fin structure in contact with the dielectric layer has a groove. In one or more of the foregoing and following embodiments, in a cross section defined by the first direction and the vertical direction, the groove has a middle portion of which width is larger than widths of a bottom portion and upper portion of the groove. In one or more of the foregoing and following embodiments, in a cross section defined by the first direction and the vertical direction, a width of the groove, from a bottom to a top, increases, decreases, increases and then decreases. In one or more of the foregoing and following embodiments, the groove includes a (111) crystal facet of Si.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of manufacturing a semiconductor device, comprising:

forming a fin structure in which first semiconductor layers and second semiconductor layers are alternately stacked over a bottom fin structure;

forming a sacrificial gate structure over the fin structure;

removing by etching the first semiconductor layers, the second semiconductor layers and an upper portion of the bottom fin structure at a source/drain region of the fin structure, which is not covered by the sacrificial gate structure;

forming a dielectric layer over the etched upper portion of the bottom fin structure by using a deposition operation and an etching operation; and forming a source/drain epitaxial layer, wherein:

the source/drain epitaxial layer is connected to ends of the second semiconductor layers, a bottom of the source/drain epitaxial layer is separated from the bottom fin structure by the dielectric layer, after the first semiconductor layers, the second semiconductor layers and the upper portion of the bottom fin structure are etched, laterally etching the first semiconductor layers, and the dielectric layer is also formed on laterally etched ends of the first semiconductor layers.

2. The method of claim 1, wherein, after the first semiconductor layers, the second semiconductor layers and the upper portion of the bottom fin structure are etched, the etched upper portion of the bottom fin structure is further etched, while the first and second semiconductor layers are protected by a cover layer.

3. The method of claim 2, wherein the etched upper portion of the bottom fin structure is etched by wet etching.

4. The method of claim 2, wherein after the etched upper portion of the bottom fin structure is further etched and before the dielectric layer is formed, the cover layer is removed.

5. The method of claim 1, further comprising, after the source/drain epitaxial layer is formed:

forming an interlayer dielectric (ILD) layer;

removing the sacrificial gate structure, thereby exposing a part of the fin structure;

removing the first semiconductor layers from the exposed fin structure, thereby forming channel layers including the second semiconductor layers; and forming a gate dielectric layer and a gate electrode layer around the channel layers.

6. The method of claim 5, wherein:

the bottom fin structure is embedded an isolation insulating layer, and the dielectric layer is made of a different material than the isolation insulating layer and the ILD layer.

7. The method of claim 5, wherein the first semiconductor layers are made of $Si_{1-x}Ge_x$ and the second semiconductor layers are made of $Si_{1-y}Ge_y$, where $0 \le x < y < 1$.

8. The method of claim 5, wherein the first semiconductor layers are made of $Si_{1-x}Ge_x$, where $0.2 \le x \le 0.8$, and the second semiconductor layers are made of Si.

9. The method of claim 1, wherein the dielectric layer is made of SiCO or SiOCN.

10. The method of claim 1, wherein the dielectric layer is made of silicon oxide or silicon nitride.

11. A method of manufacturing a semiconductor device, comprising:

forming a fin structure in which first semiconductor layers and second semiconductor layers are alternately stacked over a bottom fin structure;

forming a sacrificial gate structure over the fin structure;

forming a sidewall spacer on a side of the sacrificial gate structure;

etching the first semiconductor layers, the second semiconductor layer and an upper portion of the bottom fin structure, which are not covered by the sacrificial gate structure and the sidewall spacer;

forming a cover layer to cover the first semiconductor layers and the second semiconductor layers;

etching the upper portion of the bottom fin structure;

forming a dielectric layer over the etched upper portion of the bottom fin structure by using a deposition operation and an etching operation; and forming a source/drain epitaxial layer, wherein the method further comprises, after the first semiconductor layers, the second semiconductor layer and the upper portion of the bottom fin structure are etched and before the cover layer is formed, laterally etching the first semiconductor layers under the sidewall spacer.

12. The method of claim 11, wherein the cover layer includes a silicon oxide layer and a silicon nitride layer.

13. The method of claim 11, wherein after the etched upper portion of the bottom fin structure is further etched and before the dielectric layer is formed, the cover layer is removed.

14. The method of claim 11, wherein the etched upper portion of the bottom fin structure is etched by wet etching.

* * * * *